US012451811B2

(12) United States Patent
Ziemba et al.

(10) Patent No.: US 12,451,811 B2
(45) Date of Patent: Oct. 21, 2025

(54) NANOSECOND PULSER BIAS COMPENSATION

(71) Applicant: EHT Ventures LLC, Seattle, WA (US)

(72) Inventors: Timothy Ziemba, Bainbridge Island, WA (US); Ilia Slobodov, Seattle, WA (US); Alex Henson, Seattle, WA (US); Morgan Quinley, Seattle, WA (US); John Carscadden, Seattle, WA (US); James Prager, Seattle, WA (US); Kenneth Miller, Seattle, WA (US)

(73) Assignee: EHT Ventures LLC, Seattle, WA (US)

( * ) Notice: Subject to any disclaimer, the term of this patent is extended or adjusted under 35 U.S.C. 154(b) by 0 days.

(21) Appl. No.: 18/340,841

(22) Filed: Jun. 24, 2023

(65) Prior Publication Data

US 2023/0336085 A1    Oct. 19, 2023

Related U.S. Application Data

(63) Continuation of application No. 17/213,230, filed on Mar. 26, 2021, now Pat. No. 11,689,107, which is a
(Continued)

(51) Int. Cl.
*H02M 3/335* (2006.01)
*H02M 1/08* (2006.01)
(Continued)

(52) U.S. Cl.
CPC ......... *H02M 3/33523* (2013.01); *H02M 1/08* (2013.01); *H02M 7/5387* (2013.01);
(Continued)

(58) Field of Classification Search
CPC .. H02M 3/33523; H02M 1/08; H02M 7/5387; H03H 7/01; H03G 1/20; H03K 3/57
See application file for complete search history.

(56) References Cited

U.S. PATENT DOCUMENTS 3,339,108 A    8/1967  Holtje
4,070,589 A    1/1978  Martinkovic
(Continued)

FOREIGN PATENT DOCUMENTS

CA    2292526 A1    12/1999
CN    101534071 A    9/2009
(Continued)

OTHER PUBLICATIONS

Final Office Action in U.S. Appl. No. 15/623,464, dated Mar. 27, 2018, 18 pages.
(Continued)

*Primary Examiner* — Nguyen Tran

(57) ABSTRACT

A high voltage power system is disclosed. In some embodiments, the high voltage power system includes a high voltage pulsing power supply; a transformer electrically coupled with the high voltage pulsing power supply; an output electrically coupled with the transformer and configured to output high voltage pulses with an amplitude greater than 1 kV and a frequency greater than 1 kHz; and a bias compensation circuit arranged in parallel with the output. In some embodiments, the bias compensation circuit can include a blocking diode; and a DC power supply arranged in series with the blocking diode.

21 Claims, 22 Drawing Sheets

Related U.S. Application Data continuation of application No. 16/555,948, filed on Aug. 29, 2019, now Pat. No. 10,978,955, which is a continuation-in-part of application No. 16/523,840, filed on Jul. 26, 2019, now Pat. No. 10,892,140, and a continuation of application No. 16/250,157, filed on Jan. 17, 2019, now Pat. No. 10,734,906, which is a continuation of application No. 15/623,464, filed on Jun. 15, 2017, now Pat. No. 10,224,822, which is a continuation of application No. 14/635,991, filed on Mar. 2, 2015, now Pat. No. 9,706,630.

(60) Provisional application No. 62/789,523, filed on Jan. 8, 2019, provisional application No. 62/789,526, filed on Jan. 8, 2019, provisional application No. 62/717,523, filed on Aug. 10, 2018, provisional application No. 62/711,334, filed on Jul. 27, 2018, provisional application No. 62/711,347, filed on Jul. 27, 2018, provisional application No. 62/711,464, filed on Jul. 27, 2018, provisional application No. 62/711,467, filed on Jul. 27, 2018, provisional application No. 62/711,406, filed on Jul. 27, 2018, provisional application No. 62/711,468, filed on Jul. 27, 2018, provisional application No. 62/711,457, filed on Jul. 27, 2018, provisional application No. 61/946,457, filed on Feb. 28, 2014.

(51) Int. Cl.
  *H02M 7/5387* (2007.01)
  *H03H 7/01* (2006.01)
  *H05G 1/20* (2006.01)
  *H03K 3/57* (2006.01)

(52) U.S. Cl.
  CPC .............. *H03H 7/01* (2013.01); *H05G 1/20* (2013.01); *H03K 3/57* (2013.01)

(56) References Cited

U.S. PATENT DOCUMENTS

| | | | |
|---|---|---|---|
| 4,076,996 A | 2/1978 | Maehara et al. |
| 4,438,331 A | 3/1984 | Davis |
| 4,504,895 A | 3/1985 | Steigerwald |
| 4,885,074 A | 12/1989 | Susko et al. |
| 4,924,191 A | 5/1990 | Erb et al. |
| 4,992,919 A | 2/1991 | Lee et al. |
| 5,072,191 A | 12/1991 | Nakajima et al. |
| 5,118,969 A | 6/1992 | Ikezi et al. |
| 5,140,510 A | 8/1992 | Myers |
| 5,313,481 A | 5/1994 | Cook et al. |
| 5,321,597 A | 6/1994 | Alacoque |
| 5,325,021 A | 6/1994 | Duckworth et al. |
| 5,392,043 A | 2/1995 | Ribner |
| 5,418,707 A | 5/1995 | Shimer et al. |
| 5,451,846 A | 9/1995 | Peterson et al. |
| 5,488,552 A | 1/1996 | Sakamoto et al. |
| 5,610,452 A | 3/1997 | Shimer et al. |
| 5,623,171 A | 4/1997 | Nakajima |
| 5,629,844 A | 5/1997 | Krichtafovitch et al. |
| 5,656,123 A | 8/1997 | Salimian et al. |
| 5,729,562 A | 3/1998 | Birx et al. |
| 5,796,598 A | 8/1998 | Nowak et al. |
| 5,808,504 A | 9/1998 | Chikai et al. |
| 5,835,367 A * | 11/1998 | Pan .................. H01F 27/42 336/212 |
| 5,905,646 A | 5/1999 | Crewson et al. |
| 5,930,125 A | 7/1999 | Hitchcock et al. |
| 5,933,335 A | 8/1999 | Hitchcock et al. |
| 5,968,377 A | 10/1999 | Yuasa et al. |
| 6,059,935 A | 5/2000 | Spence |
| 6,066,901 A | 5/2000 | Burkhart et al. |
| 6,087,871 A | 7/2000 | Kardo-Syssoev et al. |
| 6,205,074 B1 | 3/2001 | Van Buskirk et al. |
| 6,222,321 B1 | 4/2001 | Scholl et al. |
| 6,233,161 B1 | 5/2001 | Balakrishnan et al. |
| 6,238,387 B1 | 5/2001 | Miller, III |
| 6,253,704 B1 | 7/2001 | Savas |
| 6,359,542 B1 | 3/2002 | Widmayer et al. |
| 6,362,604 B1 | 3/2002 | Cravey |
| 6,392,187 B1 | 5/2002 | Johnson |
| 6,416,638 B1 | 7/2002 | Kuriyama et al. |
| 6,480,399 B2 | 11/2002 | Balakrishnan et al. |
| 6,483,731 B1 | 11/2002 | Isurin et al. |
| 6,496,047 B1 | 12/2002 | Iskander et al. |
| 6,518,195 B1 | 2/2003 | Collins et al. |
| 6,577,135 B1 | 6/2003 | Matthews et al. |
| 6,741,120 B1 | 5/2004 | Tan |
| 6,741,484 B2 | 5/2004 | Crewson et al. |
| 6,831,377 B2 | 12/2004 | Yampolsky et al. |
| 6,897,574 B2 | 5/2005 | Vaysse |
| 6,947,300 B2 | 9/2005 | Pai et al. |
| 7,061,230 B2 | 6/2006 | Kleine et al. |
| 7,180,082 B1 | 2/2007 | Hassanein et al. |
| 7,256,637 B2 | 8/2007 | Iskander et al. |
| 7,291,545 B2 | 11/2007 | Collins et al. |
| 7,307,375 B2 | 12/2007 | Smith et al. |
| 7,319,579 B2 | 1/2008 | Inoue et al. |
| 7,354,501 B2 | 4/2008 | Gondhalekar et al. |
| 7,393,765 B2 | 7/2008 | Hanawa et al. |
| 7,396,746 B2 * | 7/2008 | Walther ............. H01L 21/2236 257/E21.334 |
| 7,492,138 B2 | 2/2009 | Zhang et al. |
| 7,512,433 B2 | 3/2009 | Bernhart et al. |
| 7,521,370 B2 | 4/2009 | Hoffaman |
| 7,601,619 B2 * | 10/2009 | Okumura .......... H01J 37/32935 427/523 |
| 7,605,385 B2 | 10/2009 | Bauer |
| 7,767,433 B2 | 8/2010 | Kuthi et al. |
| 7,901,930 B2 | 3/2011 | Kuthi et al. |
| 7,936,544 B2 | 5/2011 | Beland |
| 7,948,185 B2 | 5/2011 | Smith et al. |
| 7,989,987 B2 | 8/2011 | McDonald |
| 8,093,979 B2 | 1/2012 | Wilson |
| 8,115,343 B2 | 2/2012 | Sanders et al. |
| 8,129,653 B2 | 3/2012 | Kirchmeier et al. |
| 8,143,790 B2 | 3/2012 | Smith et al. |
| 8,222,936 B2 | 7/2012 | Friedman et al. |
| 8,259,476 B2 | 9/2012 | Ben-Yaakov et al. |
| 8,410,889 B2 | 4/2013 | Garrity et al. |
| 8,436,602 B2 | 5/2013 | Sykes |
| 8,450,985 B2 | 5/2013 | Gray et al. |
| 8,575,843 B2 | 11/2013 | Moore et al. |
| 8,723,591 B2 | 5/2014 | Lee et al. |
| 8,773,184 B1 | 7/2014 | Petrov et al. |
| 8,828,254 B2 | 9/2014 | Inoue et al. |
| 8,847,433 B2 | 9/2014 | Vandermey |
| 8,963,377 B2 | 2/2015 | Ziemba et al. |
| 9,067,788 B1 | 6/2015 | Spielman et al. |
| 9,070,396 B1 | 6/2015 | Katchmart et al. |
| 9,084,334 B1 | 7/2015 | Gefter et al. |
| 9,122,350 B2 | 9/2015 | Kao et al. |
| 9,122,360 B2 | 9/2015 | Xu et al. |
| 9,287,086 B2 | 3/2016 | Brouk et al. |
| 9,287,092 B2 | 3/2016 | Brouk et al. |
| 9,306,533 B1 | 4/2016 | Mavretic |
| 9,329,256 B2 | 5/2016 | Dolce |
| 9,349,603 B2 | 5/2016 | Inoue et al. |
| 9,417,739 B2 | 8/2016 | Cordeiro et al. |
| 9,435,029 B2 | 9/2016 | Brouk et al. |
| 9,493,765 B2 | 11/2016 | Krishnaswamy et al. |
| 9,601,283 B2 | 3/2017 | Ziemba et al. |
| 9,706,630 B2 | 7/2017 | Miller et al. |
| 9,767,988 B2 | 9/2017 | Brouk et al. |
| 9,811,119 B2 | 11/2017 | Seo |
| 9,960,763 B2 | 5/2018 | Miller et al. |
| 9,966,231 B2 | 5/2018 | Boswell et al. |
| 10,009,024 B2 | 6/2018 | Gan et al. |
| 10,020,800 B2 | 7/2018 | Prager et al. |
| 10,027,314 B2 | 7/2018 | Prager et al. |
| 10,044,278 B2 | 8/2018 | Kondo et al. |

(56) References Cited

U.S. PATENT DOCUMENTS

| | | |
|---|---|---|
| 10,224,822 B2 | 3/2019 | Miller et al. |
| 10,301,587 B2 | 5/2019 | Krishnaswamy et al. |
| 10,304,661 B2 | 5/2019 | Ziemba et al. |
| 10,373,755 B2 | 8/2019 | Prager et al. |
| 10,373,804 B2 | 8/2019 | Koh et al. |
| 10,382,022 B2 | 8/2019 | Prager et al. |
| 10,448,494 B1 | 10/2019 | Dorf et al. |
| 10,448,495 B1 | 10/2019 | Dorf et al. |
| 10,460,910 B2 | 10/2019 | Ziemba et al. |
| 10,460,911 B2 | 10/2019 | Ziemba et al. |
| 10,483,089 B2 | 11/2019 | Ziemba et al. |
| 10,555,412 B2 | 2/2020 | Dorf et al. |
| 10,600,619 B2 | 3/2020 | Inoue et al. |
| 10,607,814 B2 | 3/2020 | Ziemba et al. |
| 10,659,019 B2 | 5/2020 | Slobodov et al. |
| 10,707,864 B2 | 7/2020 | Miller et al. |
| 10,734,906 B2 | 8/2020 | Miller et al. |
| 10,777,388 B2 | 9/2020 | Ziemba et al. |
| 10,791,617 B2 | 9/2020 | Dorf et al. |
| 10,796,887 B2 | 10/2020 | Prager et al. |
| 10,811,230 B2 | 10/2020 | Ziemba et al. |
| 10,892,141 B2 | 1/2021 | Ziemba et al. |
| 10,978,955 B2 | 4/2021 | Ziemba et al. |
| 10,985,740 B2 | 4/2021 | Prager et al. |
| 11,004,660 B2 | 5/2021 | Prager et al. |
| 11,101,108 B2 | 8/2021 | Slobodov et al. |
| 11,171,568 B2 | 11/2021 | Miller et al. |
| 11,284,500 B2 | 3/2022 | Dorf et al. |
| 2001/0008552 A1 | 7/2001 | Harada et al. |
| 2002/0016617 A1 | 2/2002 | Oldham |
| 2002/0140464 A1 | 10/2002 | Yampolsky et al. |
| 2002/0180276 A1 | 12/2002 | Sakuma et al. |
| 2002/0186577 A1 | 12/2002 | Kirbie |
| 2003/0021125 A1 | 1/2003 | Rufer et al. |
| 2003/0021131 A1 | 1/2003 | Nadot et al. |
| 2003/0054647 A1 | 3/2003 | Suemasa et al. |
| 2003/0071035 A1 | 4/2003 | Brailove |
| 2003/0137791 A1 | 7/2003 | Arnet et al. |
| 2003/0169107 A1 | 9/2003 | LeChevalier |
| 2003/0227280 A1 | 12/2003 | Vinciarelli |
| 2004/0085784 A1 | 5/2004 | Salama et al. |
| 2004/0149217 A1 | 8/2004 | Collins et al. |
| 2004/0263412 A1 | 12/2004 | Pribyl |
| 2005/0152159 A1 | 7/2005 | Isurin et al. |
| 2005/0270096 A1 | 12/2005 | Coleman |
| 2005/0286273 A1* | 12/2005 | Ferencz ............ H02M 1/088 363/21.06 |
| 2006/0187607 A1 | 8/2006 | Mo |
| 2006/0192774 A1 | 8/2006 | Yasumura |
| 2006/0210020 A1 | 9/2006 | Takahashi et al. |
| 2006/0274887 A1 | 12/2006 | Sakamoto et al. |
| 2007/0018504 A1 | 1/2007 | Wiener et al. |
| 2007/0114981 A1 | 5/2007 | Vasquez et al. |
| 2007/0115705 A1 | 5/2007 | Gotzenberger et al. |
| 2007/0212811 A1 | 9/2007 | Hanawa et al. |
| 2008/0062733 A1 | 3/2008 | Gay |
| 2008/0106151 A1 | 5/2008 | Ryoo et al. |
| 2008/0143260 A1 | 6/2008 | Tuymer |
| 2008/0198634 A1 | 8/2008 | Scheel et al. |
| 2008/0231337 A1 | 9/2008 | Krishnaswamy et al. |
| 2008/0252225 A1 | 10/2008 | Kurachi et al. |
| 2008/0272706 A1 | 11/2008 | Kwon et al. |
| 2009/0016549 A1 | 1/2009 | French et al. |
| 2009/0108759 A1 | 4/2009 | Tao et al. |
| 2009/0322307 A1 | 12/2009 | Ide |
| 2010/0007358 A1 | 1/2010 | Schaerrer et al. |
| 2010/0141224 A1 | 6/2010 | Ilic et al. |
| 2010/0148847 A1 | 6/2010 | Schurack et al. |
| 2010/0284208 A1 | 11/2010 | Nguyen et al. |
| 2011/0001438 A1 | 1/2011 | Chemel et al. |
| 2011/0133651 A1 | 6/2011 | Chistyakov et al. |
| 2011/0140607 A1 | 6/2011 | Moore et al. |
| 2011/0309748 A1 | 12/2011 | Xia |
| 2012/0016282 A1 | 1/2012 | Van Brunt et al. |
| 2012/0052599 A1 | 3/2012 | Brouk et al. |
| 2012/0081350 A1 | 4/2012 | Sano et al. |
| 2012/0155613 A1 | 6/2012 | Caiafa et al. |
| 2013/0024784 A1 | 1/2013 | Lifton |
| 2013/0027848 A1 | 1/2013 | Said |
| 2013/0029492 A1 | 1/2013 | Inoue et al. |
| 2013/0075390 A1 | 3/2013 | Ashida |
| 2013/0092529 A1 | 4/2013 | Singh et al. |
| 2013/0113650 A1 | 5/2013 | Behbahani et al. |
| 2013/0146443 A1 | 6/2013 | Papa et al. |
| 2013/0174105 A1 | 7/2013 | Nishio et al. |
| 2013/0175575 A1 | 7/2013 | Ziemba et al. |
| 2013/0320953 A1 | 12/2013 | Cassel et al. |
| 2014/0009969 A1 | 1/2014 | Yuzurihara et al. |
| 2014/0021180 A1 | 1/2014 | Vogel |
| 2014/0077611 A1 | 3/2014 | Young et al. |
| 2014/0109886 A1 | 4/2014 | Singleton et al. |
| 2014/0118414 A1 | 5/2014 | Seo et al. |
| 2014/0146571 A1 | 5/2014 | Ryoo et al. |
| 2014/0268968 A1 | 9/2014 | Richardson |
| 2014/0349418 A1 | 11/2014 | Inoue et al. |
| 2014/0354343 A1 | 12/2014 | Ziemba et al. |
| 2015/0028932 A1 | 1/2015 | Ziemba et al. |
| 2015/0076372 A1 | 3/2015 | Ziemba et al. |
| 2015/0084509 A1 | 3/2015 | Yuzurihara et al. |
| 2015/0130525 A1 | 5/2015 | Miller et al. |
| 2015/0155086 A1 | 6/2015 | Matsuura |
| 2015/0256086 A1 | 9/2015 | Miller et al. |
| 2015/0303914 A1 | 10/2015 | Ziemba et al. |
| 2015/0311680 A1 | 10/2015 | Burrows et al. |
| 2015/0318846 A1 | 11/2015 | Prager et al. |
| 2016/0020070 A1 | 1/2016 | Kim et al. |
| 2016/0020072 A1 | 1/2016 | Brouk et al. |
| 2016/0182001 A1 | 6/2016 | Zeng et al. |
| 2016/0211153 A1 | 7/2016 | Terauchi et al. |
| 2016/0220670 A1 | 8/2016 | Kalghatgi et al. |
| 2016/0225587 A1 | 8/2016 | Inoue et al. |
| 2016/0241234 A1 | 8/2016 | Mavretic |
| 2016/0269195 A1 | 9/2016 | Coenen et al. |
| 2016/0327029 A1 | 11/2016 | Ziemba et al. |
| 2016/0327089 A1 | 11/2016 | Adam et al. |
| 2017/0083810 A1 | 3/2017 | Ielmini et al. |
| 2017/0126049 A1 | 5/2017 | Pan et al. |
| 2017/0154726 A1 | 6/2017 | Prager et al. |
| 2017/0243731 A1 | 8/2017 | Ziemba et al. |
| 2017/0294842 A1 | 10/2017 | Miller et al. |
| 2017/0311431 A1 | 10/2017 | Park |
| 2017/0359886 A1 | 12/2017 | Binderbauer et al. |
| 2017/0366173 A1 | 12/2017 | Miller et al. |
| 2018/0226896 A1 | 8/2018 | Miller et al. |
| 2018/0286636 A1 | 10/2018 | Ziemba et al. |
| 2018/0315581 A1 | 11/2018 | Hayami et al. |
| 2018/0315583 A1 | 11/2018 | Luere et al. |
| 2018/0374689 A1 | 12/2018 | Abraham et al. |
| 2019/0080884 A1 | 3/2019 | Ziemba et al. |
| 2019/0088518 A1 | 3/2019 | Koh et al. |
| 2019/0131110 A1 | 5/2019 | Ziemba et al. |
| 2019/0157044 A1 | 5/2019 | Ziemba et al. |
| 2019/0157980 A1 | 5/2019 | Ji et al. |
| 2019/0172685 A1 | 6/2019 | Van Zyl et al. |
| 2019/0180982 A1 | 6/2019 | Brouk et al. |
| 2019/0228952 A1 | 7/2019 | Dorf et al. |
| 2019/0326092 A1 | 10/2019 | Ogasawara et al. |
| 2019/0348258 A1 | 11/2019 | Koh et al. |
| 2019/0350072 A1 | 11/2019 | Dorf et al. |
| 2019/0393791 A1 | 12/2019 | Ziemba et al. |
| 2020/0035457 A1 | 1/2020 | Ziemba et al. |
| 2020/0035458 A1 | 1/2020 | Ziemba et al. |
| 2020/0043702 A1 | 2/2020 | Ziemba et al. |
| 2020/0051786 A1 | 2/2020 | Ziemba et al. |
| 2020/0154556 A1 | 5/2020 | Dorf et al. |
| 2020/0161092 A1 | 5/2020 | Inoue et al. |
| 2020/0168436 A1 | 5/2020 | Ziemba et al. |
| 2020/0352017 A1 | 11/2020 | Dorf et al. |
| 2020/0378605 A1 | 12/2020 | Lacoste |

(56) References Cited

U.S. PATENT DOCUMENTS

2020/0396820 A1  12/2020  de Vries et al.
2021/0152163 A1  5/2021  Miller et al.

FOREIGN PATENT DOCUMENTS

| | | |
|---|---|---|
| CN | 103458600 B | 12/2013 |
| CN | 106537776 A | 3/2017 |
| EP | 0174164 A2 | 3/1986 |
| EP | 0947048 A1 | 10/1999 |
| EP | 1128557 A2 | 8/2001 |
| EP | 1515430 A1 | 3/2005 |
| FR | 2771563 A1 | 5/1999 |
| JP | H09129621 A | 5/1997 |
| JP | 2002359979 A | 12/2002 |
| JP | 2013135159 A | 7/2013 |
| JP | 2016134461 A | 7/2016 |
| JP | 2017501298 A | 1/2017 |
| WO | 9738479 A1 | 10/1997 |
| WO | 0193419 A1 | 12/2001 |
| WO | 2010069317 A1 | 6/2010 |
| WO | 2014036000 A1 | 3/2014 |
| WO | 2016171582 A1 | 10/2016 |
| WO | 2018186901 A1 | 10/2018 |

OTHER PUBLICATIONS

International Search Report and Written Opinion as issued in connection with International Patent Application No. PCT/US2018/016993, mailed Apr. 18, 2018, 11 pages.
Non-Final Office Action in U.S. Appl. No. 15/889,586 dated Sep. 12, 2018, 18 pages.
Notice of Allowance in U.S. Appl. No. 14/798,154 dated Jun. 1, 2018, 05 pages.
International Search Report and Written Opinion as issued in connection with International Patent Application No. PCT/US2018/025440, mailed Jun. 25, 2018, 25 pages.
Notice of Allowance in U.S. Appl. No. 15/623,464, dated Oct. 17, 2018, 7 pages.
International Search Report and Written Opinion as issued in connection with International Patent Application No. PCT/US2018/048206, mailed Nov. 1, 2018, 10 pages.
Non Final Office Action in U.S. Appl. No. 15/941,731, dated Nov. 16, 2018, 17 pages.
Non-Final Office Action in U.S. Appl. No. 15/921,650 dated Nov. 28, 2018, 11 pages.
Non Final Office Action in U.S. Appl. No. 16/178,538, dated Jan. 11, 2019, 27 pages.
Non Final Office Action in U.S. Appl. No. 16/250,765, dated Mar. 29, 2019, 11 pages.
Notice of Allowance in U.S. Appl. No. 16/114,195, dated Apr. 3, 2019, 9 pages.
Notice of Allowance in U.S. Appl. No. 15/921,650 dated Apr. 4, 2019, 7 pages.
Non Final Office Action in U.S. Appl. No. 16/178,565, dated Apr. 4, 2019, 10 pages.
Final Office Action in U.S. Appl. No. 15/889,586 dated May 2, 2019, 19 pages.
Final Office Action in U.S. Appl. No. 15/941,731, dated May 3, 2019, 16 pages.
Final Office Action in U.S. Appl. No. 16/178,538 dated Jun. 7, 2019, 17 pages.
Notice of Allowance in U.S. Appl. No. 16/250,765, dated Jul. 10, 2019, 9 pages.
Final Office Action in U.S. Appl. No. 16/178,565, dated Jul. 12, 2019, 11 pages.
Notice of Allowance in U.S. Appl. No. 16/178,538 dated Jul. 17, 2019, 10 pages.
Non-Final Office Action in U.S. Appl. No. 15/889,586 dated Sep. 6, 2019, 17 pages.
International Preliminary Report on Patentability in connection with International Patent Application No. PCT/US2018/025440, mailed Oct. 1, 2019, 10 pages.
International Search Report and Written Opinion as issued in connection with International Patent Application No. PCT/US2019/043933, mailed Oct. 25, 2019, 9 pages.
Notice of Allowance in U.S. Appl. No. 16/178,565, dated Nov. 14, 2019, 5 pages.
Non Final Office Action in U.S. Appl. No. 15/945,722, dated Nov. 15, 2019, 13 pages.
International Search Report and Written Opinion as issued in connection with International Patent Application No. PCT/US2019/043932, mailed Dec. 5, 2019, 16 pages.
International Search Report and Written Opinion as issued in connection with International Patent Application No. PCT/US2019/043988, mailed Dec. 10, 2019, 13 pages.
Non Final Office Action in U.S. Appl. No. 16/250,157 dated Dec. 19, 2019, 6 pages.
International Search Report and Written Opinion as issued in connection with International Patent Application No. PCT/US2019/046067, mailed Jan. 3, 2020, 13 pages.
Notice of Allowance in U.S. Appl. No. 16/525,357, dated Jan. 14, 2020, 8 pages.
Non-Final Office Action in U.S. Appl. No. 16/599,318, dated Jan. 16, 2020, 11 pages.
Non-Final Office Action in U.S. Appl. No. 16/722,085, dated Mar. 6, 2020, 5 pages.
Final Office Action in U.S. Appl. No. 15/889,586 dated Mar. 18, 2020, 18 pages.
Non-Final Office Action in U.S. Appl. No. 16/523,840, dated Mar. 19, 2020, 6 pages.
Notice of Allowance in U.S. Appl. No. 15/945,722, dated Apr. 3, 2020, 7 pages.
Non-Final Office Action in U.S. Appl. No. 16/736,971, dated Apr. 7, 2020, 14 pages.
Notice of Allowance in U.S. Appl. No. 16/250,157 dated Apr. 13, 2020, 8 pages.
Non-Final Office Action in U.S. Appl. No. 16/457,791 dated Apr. 15, 2020, 12 pages.
Final Office Action in U.S. Appl. No. 16/736,971, dated Apr. 17, 2020, 6 pages.
International Search Report and Written Opinion as issued in connection with International Patent Application No. PCT/US2020/016253, mailed Apr. 29, 2020, 7 pages.
Advisory Action in U.S. Appl. No. 16/736,971, dated May 12, 2020, 5 pages.
Non-Final Office Action in U.S. Appl. No. 16/722,115, dated May 14, 2020, 6 pages.
Non-Final Office Action in U.S. Appl. No. 16/555,948, dated May 15, 2020, 8 pages.
International Search Report and Written Opinion as issued in connection with International Patent Application No. PCT/US2020/012641, mailed May 28, 2020, 15 pages.
Extended European Search Report for Application No. 18848041.2, 9 pages.
Final Office Action in U.S. Appl. No. 16/523,840, dated Jun. 26, 2020, 5 pages.
Notice of Allowance in U.S. Appl. No. 16/736,971, dated Jun. 30, 2020, 14 pages.
Advisory Action in U.S. Appl. No. 15/889,586 dated Jul. 10, 2020, 4 pages.
Notice of Allowance in U.S. Appl. No. 16/722,085, dated Jul. 16, 2020, 8 pages.
Final Office Action in U.S. Appl. No. 16/599,318, dated Jul. 23, 2020, 14 pages.
Bland, M.J., et al., "A High Power RF Power Supply for High Energy Physics Applications," Proceedings of 2005 the Particle Accelerator Conference, IEEE pp. 4018-4020 (May 16-20, 2005).
Dammertz, G., et al., "Development of Multimegawatt Gyrotrons for Fusion Plasma Heating and current Drive," IEEE Transactions on Electron Devices, vol. 52, No. 5, pp. 808-817 (Apr. 2005) (Abstract).

(56) References Cited

OTHER PUBLICATIONS

Garwin, R., "Pulsed Power Peer Review Committee Report," Sandia National Laboratories Report, SAND2000-2515, pp. 3-38 (Oct. 2000).

Gaudet, J.A., et al., "Research issues in Developing Compact Pulsed Power for High Peak Power Applications on Mobile Platforms," Proceedings of the IEEE, vol. 92, No. 7, pp. 1144-1165 (Jul. 2004).

Goodman, E. A., "Characteristics of sheet windings in transformers", IEEE Engineering, vol. 82, No. 11, pp. 673-676 (Nov. 1963) (Abstract).

In, Y., et al., "On the roles of direct feedback and error field correction in stabilizing resistive-wall modes," Nuclear 2 Fusion, vol. 50, No. 4, pp. 1-5 (2010).

Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).

Locher, R., "Introduction to Power MOSFETs and their Applications (Application Note 558)," Fairchild Semiconductor, 15 pages (Oct. 1998).

Locher, R.E., and Pathak, A.D., "Use of BiMOSFETs in Modern Radar Transmitters," IEEE International Conference on Power Electronics and Drive Systems, pp. 776-782 (2001).

Pokryvailo, A., et al., "A 1KW Pulsed Corona System for Pollution Control Applications," 14th IEEE International Pulsed Power Conference, Dallas, TX, USA (Jun. 15-18, 2003).

Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).

Prager, J.R. et al., "A High Voltage Nanosecond Pulser with Variable Pulse Width and Pulse Repetition Frequency control For Nonequilibrium Plasma Applications", 41st International Conference on Plasma Sciences held with 2014 IEEE International Conference on High-Power Particle Beams, May 25-29, 2014, 6, Washington, D.C.

Pustylnik, M., et al., "High-voltage nanosecond pulses in a low-pressure radiofrequency discharge", Physical Review E, vol. 87, No. 6, pp. 1-9 (2013).

Quinley, M., et al., "High Voltage Nanosecond Pulser Operating at 30 kW and 400 kHz" APS-GEC-2018, 1 page (2018).

Rao, X., et al., "Combustion Dynamics of Plasma-Enhanced Premixed and Nonpremixed Flames," IEEE Transactions on Plasma Science, vol. 38, No. 12, pp. 3265-3271 (Dec. 2010).

Reass, W.A., et al., "Progress Towards a 20 KV, 2 KA Plasma Source Ion Implantation Modulator for Automotive Production of Diamond Film on Aluminum," Submitted to 22nd International Power Symposium, Boca Raton, FL, 6 pages (Jun. 24-27, 1996).

Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).

Schamiloglu, E., et al., "Scanning the Technology: Modem Pulsed Power: Charlie Martin and Beyond," Proceedings of the IEEE, vol. 92, No. 7 , pp. 1014-1020 (Jul. 2004).

Scoville, J.T., et al., "The Resistive Wall Mode Feedback Control System on DIII-D," IEEE/NPSS 18th Symposium on fusion Engineering, Albuquerque, NM, Oct. 25-29, 1999, General Atomics Report GAA23256, 7 pages (Nov. 1999).

Singleton, D.R., et al., "Compact Pulsed-Power System for Transient Plasma Ignition," IEEE Transactions on Plasma Science, vol. 37, No. 12, pp. 2275-2279 (2009) (Abstract).

Singleton, D.R., et al., "Low Energy Compact Power Modulators for Transient Plasma Ignition," IEEE Transactions on Dielectrics and Electrical Insulation, vol. 18, No. 4, pp. 1084-1090 (Aug. 2011) (Abstract).

Starikovskiy, A., and Aleksandrov, N., "Plasma-assisted ignition and combustion," Progress in Energy and Combustion Science, vol. 39, No. 1, pp. 61-110 (Feb. 2013).

Wang, F., et al., "Compact High Repetition Rate Pseudospark Pulse Generator," IEEE Transactions on Plasma Science, vol. 33, No. 4, pp. 1177-1181 (Aug. 2005) (Abstract).

Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).

Zhu, Z., et al., "High Voltage pulser with a fast fall-time for plasma immersion ion implantation," Review of Scientific Instruments, vol. 82, No. 4, pp. 045102-1-045102-4 (Apr. 2011).

International Search Report and Written Opinion as issued in connection with International Patent Application No. PCT/US2014/040929, mailed Sep. 15, 2014, 10 pages.

International Search Report and Written Opinion as issued in connection with International Patent Application No. PCT/US2014/065832, mailed Feb. 20, 2015, 13 pages.

Invitation to pay additional fees in PCT Application No. PCT/US2015/018349 mailed on May 15, 2015, 2 pages.

International Search Report and Written Opinion as issued in connection with International Patent Application No. PCT/US2015/018349, mailed Jul. 14, 2015, 15 pages.

International Search Report and Written Opinion as issued in connection with International Patent Application No. PCT/US2015/040204, mailed Oct. 6, 2015, 12 pages.

Non-Final Office Action in U.S. Appl. No. 14/542,487 dated Nov. 23, 2015, 11 pages.

Non-Final Office Action in U.S. Appl. No. 14/798,154 dated Jan. 5, 2016, 13 pages.

Final Office Action in U.S. Appl. No. 14/542,487 dated Feb. 12, 2016, 11 pages.

Non-Final Office Action in U.S. Appl. No. 14/542,487 dated Apr. 8, 2016, 12 pages.

International Preliminary Report on Patentability in PCT Application No. PCT/US2014/065832 mailed on May 17, 2016, 7 pages.

Non Final Office Action in U.S. Appl. No. 14/635,991, dated Jul. 29, 2016, 17 pages.

International Preliminary Report on Patentability in PCT Application No. PCT/US2015/018349 mailed on Sep. 6, 2016, 8 pages.

Final Office Action in U.S. Appl. No. 14/798,154 dated Oct. 6, 2016, 14 pages.

Final Office Action in U.S. Appl. No. 14/542,487 dated Dec. 12, 2016, 13 pages.

International Preliminary Report on Patentability in PCT Application No. PCT/US2015/040204 mailed on Jan. 17, 2017, 7 pages.

Final Office Action in U.S. Appl. No. 14/635,991, dated Jan. 23, 2017, 22 pages.

Advisory Action in U.S. Appl. No. 14/542,487 dated Mar. 28, 2017, 03 pages.

Notice of Allowance in U.S. Appl. No. 14/635,991, dated May 4, 2017, 07 pages.

Non-Final Office Action in U.S. Appl. No. 14/798,154 dated May 26, 2017, 16 pages.

Non-Final Office Action in U.S. Appl. No. 14/542,487 dated Jun. 5, 2017, 12 pages.

Partial Supplementary European Search Report in related foreign application No. 14861818.4, 12 Pages.

Non Final Office Action in U.S. Appl. No. 15/623,464, dated Nov. 7, 2017, 18 pages.

Final Office Action in U.S. Appl. No. 14/542,487 dated Dec. 19, 2017, 07 pages.

Final Office Action in U.S. Appl. No. 14/798,154 dated Dec. 28, 2017, 06 pages.

Notice of Allowance in U.S. Appl. No. 14/542,487 dated Mar. 21, 2018, 05 pages.

Notice of Allowance in U.S. Appl. No. 16/599,318, dated Aug. 4, 2020, 8 pages.

Non Final Office Action in U.S. Appl. No. 16/537,513, dated Sep. 3, 2020, 13 pages.

Non-Final Office Action in U.S. Appl. No. 15/889,586 dated Sep. 18, 2020, 19 pages.

International Search Report and Written Opinion as issued in connection with International Patent Application No. PCT/US2020/040579, mailed Sep. 30, 2020, 10 pages.

Notice of Allowance in U.S. Appl. No. 16/523,840, dated Sep. 30, 2020, 11 pages.

(56) References Cited

OTHER PUBLICATIONS

International Search Report and Written Opinion as issued in connection with International Patent Application No. PCT/US2020/034427, mailed Oct. 16, 2020, 9 pages.
Non Final Office Action in U.S. Appl. No. 16/903,374, dated Nov. 25, 2020, 16 pages.
Final Office Action in U.S. Appl. No. 16/722,115, dated Dec. 2, 2020, 7 pages.
Notice of Allowance in U.S. Appl. No. 16/523,840, dated Dec. 4, 2020, 11 pages.
Notice of Allowance in U.S. Appl. No. 16/555,948, dated Jan. 13, 2021, 7 pages.
Notice of Allowance in U.S. Appl. No. 16/457,791 dated Jan. 22, 2021, 7 pages.
International Search Report and written opinion received for PCT Patent Application No. PCT/US2020/60799, mailed in Feb. 5, 2021, 11 pages.
Notice of Allowance in U.S. Appl. No. 16/848,830, dated Feb. 19, 2021, 8 pages.
Extended European Search Report for Application No. 20195265.2, 8 pages.
Notice of Allowance in U.S. Appl. No. 16/722,115, dated Apr. 1, 2021, 9 pages.
Notice of Allowance in U.S. Appl. No. 15/889,586 dated Apr. 14, 2021, 9 pages.
Non Final Office Action in U.S. Appl. No. 16/941,532, dated Apr. 14, 2021, 10 pages.
Extended European Search Report for Application No. 20200919.7, 11 pages.
Non-Final Office Action in U.S. Appl. No. 16/722,115, dated May 3, 2021, 9 pages.
Notice of Allowance in U.S. Appl. No. 16/848,830, dated May 13, 2021, 6 pages.
Non-Final Office Action in U.S. Appl. No. 15/889,586 dated Jun. 11, 2021, 11 pages.
International Preliminary Report on Patentability in connection with International Patent Application No. PCT/US2020/012641, mailed Jun. 16, 2021, 11 pages.
Non-Final Office Action in U.S. Appl. No. 16/941,532 dated Jul. 16, 2021, 10 pages.
Notice of Allowance in U.S. Appl. No. 16/903,374, dated Jul. 19, 2021, 8 pages.
Non-Final Office Action in U.S. Appl. No. 17/223,004, dated Aug. 31, 2021, 12 pages.
Non-Final Office Action in U.S. Appl. No. 17/033,662 dated Sep. 1, 2021, 17 pages.
Notice of Allowance in U.S. Appl. No. 16/737,615 dated Nov. 24, 2021, 11 pages.
Final Office Action in U.S. Appl. No. 17/033,662 dated Dec. 8, 2021, 17 pages.
Non-Final Office Action in U.S. Appl. No. 17/213,230 dated Dec. 14, 2021, 6 pages.
English translation of Office Action for Taiwan application No. 109100609 mailed Dec. 16, 2021, 5 pages.
Notification of Reason for Refusal in JP Patent application No. 2021-101259 dated Feb. 1, 2022, 21 pages.
Non-Final Office Action in U.S. Appl. No. 17/163,331 dated Mar. 4, 2022, 23 pages.
Notice of Allowance in U.S. Appl. No. 16/941,532, dated Apr. 5, 2022, 9 pages.
Final Office Action in U.S. Appl. No. 17/223,004 dated May 11, 2022, 9 pages.
Final Office Action in U.S. Appl. No. 17/213,230 dated May 16, 2022, 16 pages.
Non-Final Office Action in U.S. Appl. No. 17/499,863 dated Jun. 7, 2022, 15 pages.
Notice of Allowance in U.S. Appl. No. 17/223,004 dated Jul. 25, 2022, 8 pages.
Advisory Action in U.S. Appl. No. 17/213,230 dated Aug. 5, 2022, 3 pages.
Non-Final Office Action in U.S. Appl. No. 17/213,230 dated Sep. 15, 2022, 9 pages.
Notice of Allowance in U.S. Appl. No. 17/499,863 dated Oct. 19, 2022, 7 pages.
Notice of Allowance in U.S. Appl. No. 17/098,207 dated Jan. 5, 2023, 15 pages.
Notice of Allowance in U.S. Appl. No. 17/033,662, dated Feb. 7, 2023, 9 pages.
Notice of Allowance in U.S. Appl. No. 17/834,933 mailed on Feb. 16, 2023, 9 pages.
Non-Final Office Action in U.S. Appl. No. 17/411,028 dated Feb. 24, 2023, 6 pages.
Notice of Allowance in U.S. Appl. No. 17/213,230 dated Mar. 8, 2023, 7 pages.
Final Office Action in U.S. Appl. No. 17/411,028 dated Jun. 22, 2023, 9 pages.
Notice of Allowance in U.S. Appl. No. 17/411,028 dated Aug. 30, 2023, 9 pages.
Notice of Allowance in U.S. Appl. No. 15/941,731, dated Jul. 17, 2019, 12 pages.
Extended European Search Report for Application No. 23158873.2, 9 pages.
Office Action in KR Patent application No. 2023-7028274 dated Apr. 19, 2024, 4 pages.

* cited by examiner

NANOSECOND PULSER BIAS COMPENSATION

CROSS-REFERENCE TO RELATED APPLICATIONS

This application is a continuation in part of U.S. patent application Ser. No. 16/250,157 filed Jan. 17, 2019, titled "Nanosecond Pulser," which is incorporated by reference in its entirety and is a continuation of and claims priority to U.S. patent application Ser. No. 15/623,464 filed Jun. 15, 2017, titled "Nanosecond Pulser," which is incorporated by reference in its entirety and is a continuation of and claims priority to U.S. patent application Ser. No. 14/635,991 filed Mar. 2, 2015, titled "Galvanically isolated output variable pulse generator disclosure," which is incorporated by reference in its entirety and claims priority to U.S. Provisional Patent Application No. 61/946,457 filed Feb. 28, 2014, titled "Galvanically isolated output variable pulse generator disclosure," which is incorporated by reference in its entirety.

This application is a continuation in part of U.S. patent application Ser. No. 16/523,840 filed Jul. 26, 2019, titled "Nanosecond Pulser Bias Compensation," which is incorporated by reference in its entirety and claims priority to the following provisional patent applications U.S. Provisional Patent Application No. 62/711,464 filed Jul. 27, 2018, titled "NANOSECOND PULSER SYSTEM," which is incorporated by reference in its entirety, U.S. Provisional Patent Application No. 62/711,334 filed Jul. 27, 2018, titled "NANOSECOND PULSER THERMAL MANAGEMENT," which is incorporated by reference in its entirety, U.S. Provisional Patent Application No. 62/711,457 filed Jul. 27, 2018, titled "NANOSECOND PULSER PULSE GENERATION," which is incorporated by reference in its entirety, U.S. Provisional Patent Application No. 62/711,347 filed Jul. 27, 2018, titled "NANOSECOND PULSER ADC SYSTEM," which is incorporated by reference in its entirety, to U.S. Provisional Patent Application No. 62/711,467 filed Jul. 27, 2018, titled "EDGE RING POWER SYSTEM," which is incorporated by reference in its entirety, U.S. Provisional Patent Application No. 62/711,406 filed Jul. 27, 2018, titled "NANOSECOND PULSER BIAS COMPENSATION," which is incorporated by reference in its entirety, U.S. Provisional Patent Application No. 62/711,468 filed Jul. 27, 2018, titled "NANOSECOND PULSER CONTROL MODULE," which is incorporated by reference in its entirety, to U.S. Provisional Patent Application No. 62/717,523 filed Aug. 10, 2018, titled "PLASMA SHEATH CONTROL FOR RF PLASMA REACTORS," which is incorporated by reference in its entirety, U.S. Provisional Patent Application No. 62/789,523 filed Jan. 8, 2019, titled "EFFICIENT NANOSECOND PULSER WITH SOURCE AND SINK CAPABILITY FOR PLASMA CONTROL APPLICATIONS," which is incorporated by reference in its entirety, and to U.S. Provisional Patent Application No. 62/789,526 filed Jan. 8, 2019, titled "EFFICIENT ENERGY RECOVERY IN A NANOSECOND PULSER CIRCUIT," which is incorporated by reference in its entirety.

BACKGROUND

In plasma deposition systems, a wafer is often electrostatically secured with a chuck in a chamber. Plasmas are created within the chamber and high voltage pulses are introduced to accelerate ions within the plasma onto the wafer. If the electric potential between the chuck and the wafer exceeds a certain voltage threshold (e.g., about +2 kV), the forces on the wafer may be large enough to damage or break the wafer.

SUMMARY

Embodiments of the invention include a method and circuits for bias compensation in a high voltage plasma chamber such as, for example, a plasma deposition system, semiconductor fabrication system, plasma sputtering system, etc.

A high voltage power system is disclosed. In some embodiments, the high voltage power system includes a high voltage pulsing power supply (e.g., a nanosecond pulser); a transformer electrically coupled with the high voltage pulsing power supply; an output electrically coupled with the transformer. The output of the high voltage power system can be configured to output high voltage pulses with an amplitude greater than 1 kV, 2 kV, 5 kV, 10 kV, 25 kV, etc. and a frequency greater than 1 kHz; and a bias compensation circuit arranged in parallel with the output. In some embodiments, the bias compensation circuit can include a blocking diode; and a DC power supply arranged in series with the blocking diode. In some embodiments, the high voltage power system can include a bias capacitor arranged across at least the DC power supply. In some embodiments, the high voltage power system may include a bias compensation inductor arranged in series with the high voltage switch.

In some embodiments, the high voltage pulsing power supply comprises a nanosecond pulser and a transformer. In some embodiments, the high voltage power supply comprises a plurality of switches arranged in series and a transformer. In some embodiments, the high voltage power supply include a radio-frequency power supply such as, for example, an RF generator.

In some embodiments, the bias compensation circuit comprises a high voltage switch disposed across the blocking diode, wherein the high voltage switch is configured to be open when the high voltage pulsing power supply is pulsing, and wherein the high voltage switch is configured to be closed when the high voltage pulsing power supply is not pulsing.

In some embodiments, the high voltage switch comprises a plurality of switches arranged in series. In some embodiments, the bias compensation inductor has an inductance less than about 100 µH. In some embodiments, the output is coupled with a plasma such as, for example, via an electrode that is capacitively coupled with the plasma.

In some embodiments, a high voltage power system may include a high voltage pulsing power supply; an output electrically coupled with the transformer and configured to output high voltage pulses with an amplitude greater than 2 kV and a frequency greater than 2 kHz; a blocking diode; a DC power supply; arranged in series with the blocking diode, the blocking diode and the DC power supply arranged in parallel with the output; and a high voltage switch coupled across the blocking diode, wherein the high voltage switch is configured to turn off when the high voltage switching power supply is pulsing (e.g., during bursts), and the high voltage switch is turned on when the high voltage switching power supply is not pulsing (e.g., in between bursts).

In some embodiments, the high voltage power system may also include a bias compensation capacitor arranged across at least the DC power supply having a capacitance less than about 500 µF, 250 µF, 100 µF, 50 µF, 25 µF, 10 µF, etc.

In some embodiments, the blocking diode, the DC power supply, and the high voltage switch comprise a bias compensation circuit that is arranged in the high voltage power system across the output.

In some embodiments, the output may include a plasma load. In some embodiments, the DC power supply provides about ±5 kV, ±4 kV, ±3 kV, ±2, kV, ±1 kV, etc.

In some embodiments, the high voltage switch is configured to be open when the high voltage pulsing power supply is pulsing, and wherein the high voltage switch is configured to be closed when the high voltage pulsing power supply is not pulsing.

In some embodiments, the high voltage switch includes a snubber circuit.

Some embodiments may include a method comprising opening a bias compensation switch that is arranged in series with a DC power supply, the bias compensation switch and the DC power supply being arranged across a load; pulsing a high voltage power supply with a high voltage and a high frequency into the load; closing the bias compensation switch; and not pulsing the high voltage power supply.

Some embodiments include a high voltage power system comprising a plurality of switches; a transformer; an output configured to output high voltage pulses with an amplitude greater than 2 kV and a frequency greater than 1 kHz; a blocking diode; and a bias capacitor.

Some embodiments include a high voltage power system comprising: a high voltage switching power supply; an output configured to output high voltage pulses with an amplitude greater than 2 kV and a frequency greater than 1 kHz; a blocking diode; a bias capacitor; and a high voltage switch coupled across the blocking diode, wherein the high voltage switch is off when the high voltage switching power supply is pulsing, and the high voltage switch is on when the high voltage switching power supply is not pulsing.

Some embodiments include a high voltage power system producing an output that creates a plasma within a wafer deposition chamber such that the voltage potential between the wafer and a chuck is about 2 kV during periods with the high voltage power system is pulsing and not pulsing.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

In plasma deposition systems a wafer is often electrostatically secured with a chuck in a deposition chamber. Plasmas are created within the chamber and high voltage pulses are introduced to accelerate ions within the plasma onto the wafer. If the electric potential between the chuck and the wafer exceeds a certain voltage threshold (e.g., about 2 kV), the forces on the wafer may be large enough to damage or break the wafer. In addition, it can be beneficial to introduce higher voltage pulses into the chamber to increase trench depth, improve quality, or to speed up the etching process. The introduction of high and higher voltage pulses into the plasma within the deposition chamber can affect the electric potential between the chuck and the wafer and damage or break the wafers.

Systems and methods are disclosed to ensure the voltage between a wafer and a chuck is near or below the threshold (e.g., about 2 kV) during periods of high voltage pulsing and during periods without high voltage pulsing. These systems, for example, may also limit the self-biasing of the wafer when using high-voltage radio-frequency power supplies. These systems and methods, for example, may compensate for voltage changes to ensure the voltage between the chuck and wafer does not exceed the voltage threshold.

In some embodiments, a high voltage power system may produce pulse voltages that are introduced into the plasma with amplitudes of about 1 kV, 2 kV, 5 kV, 10 kV, 15 kV, 20 kV, 30 kV, 40 kV, etc. In some embodiments, a high voltage power system may switch with frequencies up to about 500 kHz. In some embodiments, a high voltage power system may provide single pulses of varying pulse widths from about 50 nanoseconds to about 1 nanosecond. In some embodiments, a high voltage power system may switch at frequencies greater than about 10 kHz. In some embodiments, a high voltage power system may operate with rise times less than about 20 ns.

As used throughout this document, the term "high voltage" may include a voltage greater than about 1 kV, 10 kV, 20 kV, 50 kV, 100 kV, 1,000 kV, etc.; the term "high frequency" may be a frequency greater than about 1 kHz, 10 kHz, 100 kHz, 200 kHz, 500 kHz, 1 MHz, etc.; the term "high repetition rate" may be a rate greater than about 1 kHz, 10 kHz, 100 kHz, 200 kHz, 500 kHz, 1 MHz, etc., the term "fast rise time" may include a rise time less than about 1 ns, 10 ns, 50 ns, 100 ns, 250 ns, 500 ns, 1,000 ns, etc.; the term "fast fall time" may include a fall time less than about 1 ns, 10 ns, 50 ns, 100 ns, 250 ns, 500 ns, 1,000 ns, etc.; the term "low capacitance" may include capacitance less than about 1.0 pF, 10 pF, 100 pF, 1,000 pF, etc.; the term "low inductance" may include inductance less than about 10 nH, 100 nH, 1,000 nH, 10,000 nH, etc.; and the term short pulse width may include pulse widths less than about 10,000 ns, 1,000 ns, 500 ns, 250 ns, 100 ns, 20 ns, etc.

Figure 1:
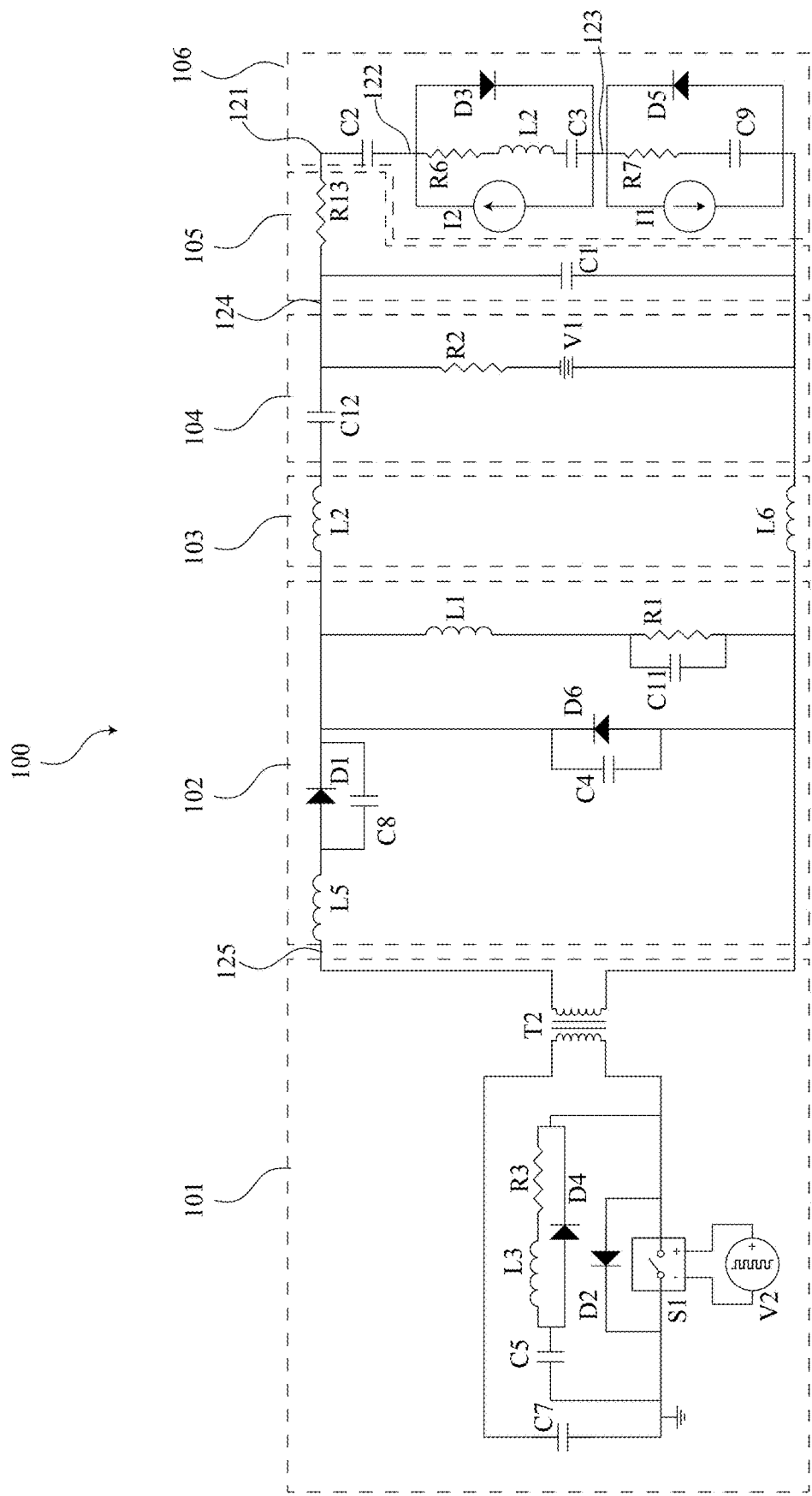
FIG. 1 is a circuit diagram of a high voltage power system with a plasma load according to some embodiments.

FIG. 1 is a circuit diagram of a high voltage power system with a plasma load 100 according to some embodiments. The high voltage power system with a plasma load 100 can be generalized into six stages (these stages could be broken down into other stages or generalized into fewer stages or may or may not include the components shown in the figure). The high voltage power system with a plasma load 100 includes a pulser stage 101, a resistive output stage 102, a lead stage 103, a DC bias circuit 104, a second lead stage 105, and a load stage 106. The pulser stage 101, the resistive output stage 102, or the DC bias circuit 104 may comprise a high voltage power system. The lead stage 103 or the second lead stage 105 may also be included in the high voltage power system. Whereas the load stage 106 may include a plasma load.

In some embodiments, the high voltage power system with a plasma load 100 (or the pulser stage 101) can introduce pulses into the load stage with voltages greater than 1 kV, 10 kV, 20 kV, 50 kV, 100 kV, 1,000 kV, etc., with rise times less than about 1 ns, 10 ns, 50 ns, 100 ns, 250 ns, 500 ns, 1,000 ns, etc. with fall times less than about 1 ns, 10 ns, 50 ns, 100 ns, 250 ns, 500 ns, 1,000 ns, etc. and frequencies greater than about 1 kHz, 10 kHz, 100 kHz, 200 kHz, 500 kHz, 1 MHz, etc.

In some embodiments, the pulser stage 101, for example, may include any device capable of producing pulses greater than 500 V, peak current greater than 10 Amps, or pulse widths of less than about 10,000 ns, 1,000 ns, 100 ns, 10 ns, etc. As another example, the pulser stage 101 may produce pulses with an amplitude greater than 1 kV, 5 kV, 10 kV, 50 kV, 200 kV, etc. As another example, the pulser stage 101 may produce pulses with rise times or fall times less than about 5 ns, 50 ns, or 300 ns, etc.

In some embodiments, the pulser stage 101 can produce a plurality of high voltage bursts. Each burst, for example, can include a plurality of high voltage pulses with fast rise times and fast fall times. The plurality of high voltage bursts, for example, can have a burst repetition frequency of about 10 Hz to 10 kHz. More specifically, for example, the plurality of high voltage bursts can have a burst repetition frequency of about 10 Hz, 100 Hz, 250 Hz, 500 Hz, 1 kHz, 2.5 kHz, 5.0 kHz, 10 kHz, etc.

Within each of the plurality of high voltage bursts, the high voltage pulses can have a pulse repetition frequency of about 1 kHz, 10 kHz, 100 kHz, 200 kHz, 500 kHz, 1 MHz, etc., In some embodiments, the burst repetition frequency time from one burst till the next burst. Frequency at which the bias compensation switch is operated.

In some embodiments, the pulser stage 101 can include one or more solid state switches S1 (e.g., solid state switches such as, for example, IGBTs, a MOSFETs, a SiC MOSFETs, SiC junction transistors, FETs, SiC switches, GaN switches, photoconductive switches, etc.) coupled with a voltage source V2. In some embodiments, the pulser stage 101 can include one or more source snubber resistors R3, one or more source snubber diodes D4, one or more source snubber capacitors C5, or one or more source freewheeling diodes D2. One or more switches and or circuits can be arranged in parallel or series.

In some embodiments, the pulser stage 101 can produce a plurality of high voltage pulses with a high frequency, fast rise times, fast fall times, at high frequencies, etc. The pulser stage 101 may include one or more nanosecond pulsers.

In some embodiments, the pulser stage 101 may comprise a high voltage pulsing power supply.

The pulser stage 101 may, for example, include any pulser described in U.S. patent application Ser. No. 14/542,487, titled "High Voltage Nanosecond Pulser," which is incorporated into this disclosure in its entirety for all purposes. The pulser stage 101 may, for example, include any pulser described in U.S. Pat. No. 9,601,283, titled "Efficient IGBT Switching," which is incorporated into this disclosure in its entirety for all purposes. The pulser stage 101 may, for example, include any pulser described in U.S. patent application Ser. No. 15/365,094, titled "High Voltage Transformer," which is incorporated into this disclosure in its entirety for all purposes.

Figure 3:
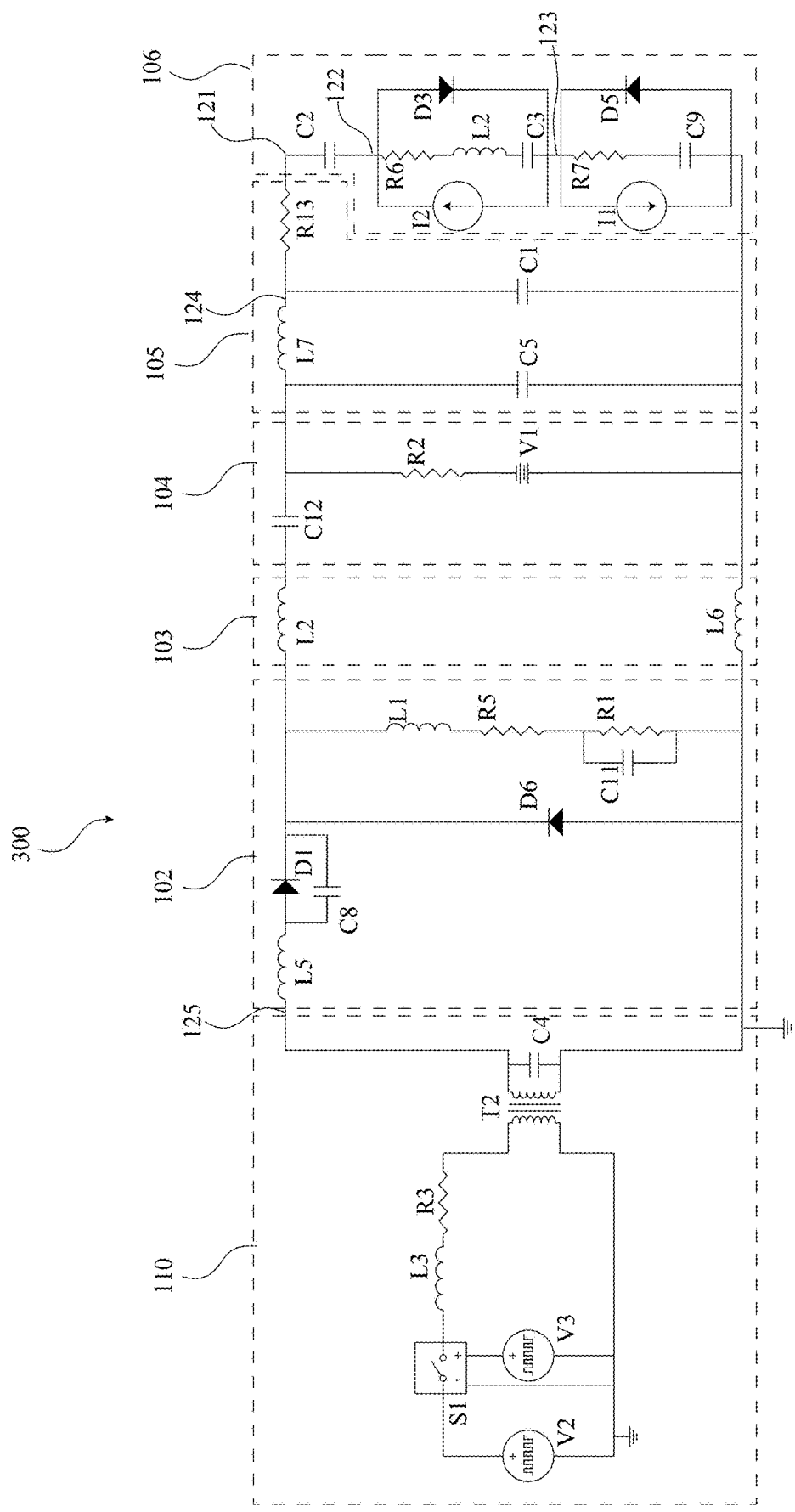
FIG. 3 is a circuit diagram of a high voltage power system with a plasma load according to some embodiments.

The pulser stage 101 may, for example, include a high voltage switch (e.g., see FIG. 3). For example, the pulser stage 101 may include the high voltage switch 1500 described in FIG. 15. As another example, the pulser stage 101 may, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, the pulser stage 101 can include a transformer T2. The transformer T2 may include a transformer core (e.g., a toroid or non-toroid core); at least one primary winding wound once or less than once around the transformer core; and a secondary winding wound around the transformer core a plurality of times.

In some embodiments, the transformer T2 may include a single-turn primary winding and a multi-turn secondary windings around a transformer core. The single-turn primary winding, for example, may include one or more wires wound one or fewer times around a transformer core. The single-turn primary winding, for example, may include more than 2, 10, 20, 50, 100, 250, 1200, etc. individual single-turn primary windings. In some embodiments, the primary winding may include a conductive sheet.

The multi-turn secondary winding, for example, may include a single wire wound a plurality of times around the transformer core. The multi-turn secondary winding, for example, may be wound around the transformer core more than 2, 10, 25, 50, 100, 250, 500, etc. times. In some embodiments, a plurality of multi-turn secondary windings may be wound around the transformer core. In some embodiments, the secondary winding may include a conductive sheet.

In some embodiments, the high-voltage transformer may be used to output a voltage greater than 1,000 volts with a fast rise time of less than 150 nanoseconds or less than 50 nanoseconds, or less than 5 ns.

In some embodiments, the high-voltage transformer may have a low impedance and/or a low capacitance. For example, the high-voltage transformer has a stray inductance of less than 100 nH, 50 nH, 30 nH, 20 nH, 10 nH, 2 nH, 100 pH as measured on the primary side and/or the transformer has a stray capacitance of less than 100 pF, 30 pF, 10 pF, 1 pF as measured on the secondary side.

The transformer T2 may comprise a transformer as disclosed in U.S. patent application Ser. No. 15/365,094, titled "High Voltage Transformer," which is incorporated into this document for all purposes.

In some embodiments, a plurality of pulsers can be combined either or both in parallel or series. In some embodiments, the pulser stage 101 may be coupled with the resistive output stage 102 across the inductor L1 and/or the resistor R1. In some embodiments, inductor L1 may include an inductance of about 5 µH to about 25 µH. In some embodiments, the resistor R1 may include a resistance of about 50 ohms to about 250 ohms. Each of the plurality of pulser stages 101 may each also include either or both blocking diode D4 or diode D6. In some embodiments, the capacitor C4 may represent the stray capacitance of the diode D6.

In some embodiments, the resistive output stage 102 can discharge capacitive loads (e.g., the wafer and/or the plasma).

In some embodiments, the resistive output stage 102 may include one or more inductive elements represented by inductor L1 and/or inductor L5. The inductor L5, for example, may represent the stray inductance of the leads in the resistive output stage 102 and may have an inductance less than about 500 nH, 250 nH, 100 nH, 50 nH, 25 nH, 10 nH, etc. The inductor L1, for example, may be set to minimize the power that flows from the pulser stage 101 into resistor R1.

In some embodiments, the resistive output stage 102 may include at least one resistor R1, which may, for example, comprise a plurality of resistors in series or parallel, that can discharge a load (e.g., the plasma sheath capacitance).

In some embodiments, the resistor R1 may dissipate charge from the load stage 106, for example, on fast time scales (e.g., 1 ns, 10 ns, 50 ns, 100 ns, 250 ns, 500 ns, 1,000 ns, etc. time scales). The resistance of resistor R1 may be low to ensure the pulse across the load stage 106 has a fast fall time tr.

In some embodiments, the resistive output stage 102 may be configured to discharge over about 1 kilowatt of average power during each pulse cycle and/or a joule or less of energy in each pulse cycle. In some embodiments, the resistance of the resistor R1 in the resistive output stage may be less than 200 ohms.

The capacitor C11 may represent the stray capacitance of the resistor R1 (or the plurality of resistors arranged in series or parallel represented by resistor R1) including the capacitance of the arrangement of series and/or parallel resistors. The capacitance of stray capacitance C11, for example, may be less than 500 pF, 250 pF, 100 pF, 50 pF, 10 pF, 1 pF, etc. The capacitance of stray capacitance C11, for example, may be less than the load capacitance such as, for example, less than the total capacitance of C2, C3, and/or C9 or the individual capacitance of C2, C3, or C9.

In some embodiments, the resistive output stage 102 may include a collection of circuit elements that can be used to control the shape of a voltage waveform on a load. In some embodiments, the resistive output stage 102 may include passive elements only (e.g., resistors, capacitors, inductors, etc.). In some embodiments, the resistive output stage 102 may include active circuit elements (e.g., switches) as well as passive circuit elements. In some embodiments, the resistive output stage 102, for example, can be used to control the voltage rise time of a waveform and/or the voltage fall time of a waveform.

In some embodiments, a resistive output stage 102 can be used in circuits with pulses having either or both high pulse voltage (e.g., voltages greater than 1 kV, 10 kV, 20 kV, 50 kV, 100 kV, etc.) or high frequencies (e.g., frequencies greater than 1 kHz, 10 kHz, 100 kHz, 200 kHz, 500 kHz, 1 MHZ, etc.).

In some embodiments, the resistive output stage 102 may be selected to handle high average power, high peak power, fast rise time fast fall times. For example, the average power rating might be greater than about 0.5 kW, 1.0 KW, 10 KW, 25 KW, etc., or the peak power rating might be greater than about 1 kW, 10 kW, 100 KW, 1 MW, etc.

In some embodiments, the resistive output stage 102 may include a series or parallel network of passive components. For example, the resistive output stage 102 may include a series of a resistor, a capacitor, and an inductor. As another example, the resistive output stage 102 may include a capacitor in parallel with an inductor and the capacitor-inductor combination in series with a resistor.

In some embodiments, the blocking diode D1, for example, may ensure current flows through the resistor R1. The capacitor C8, for example, may represent the stray capacitance of the blocking diode D1.

In some embodiments, the resistive output stage 102 may be replaced by an energy recovery circuit or any other sink stage or any other circuitry that can quickly sink charge from the plasma on fast time scales.

In some embodiments, the lead stage 103 may represent either or both the leads or traces between the resistive output stage 102 and the DC bias circuit 104. Either or both the inductor L2 or the inductor L6 may represent the inductance with either or both the leads or traces.

In this example, the DC bias circuit 104 does not include any bias compensation. The DC bias circuit 104 includes an offset supply voltage V1 that may, for example, bias the output voltage either positively or negatively. In some embodiments, the offset supply voltage V1, can be adjusted to change the offset between the wafer voltage and the chuck voltage. In some embodiments, offset supply voltage V1 can have a voltage of about ±5 kV, ±4 kV, ±3 kV, ±2, kV, ±1 kV, etc. kV.

In some embodiments, the bias capacitor C12 can isolate (or separate) the DC bias voltage from either or both the resistive output stage or other circuit elements. The bias capacitor C12, for example, may allow for a potential shift from one portion of the circuit to another. In some embodiments, this potential shift may ensure that the electrostatic force holding the wafer in place on the chuck remains below the voltage threshold. The resistor R2 may isolate the DC bias supply from the high voltage pulsed output from the pulser stage 101.

The bias capacitor C12, for example, 100 pF, 10 pF, 1 pF, 100 µF, 10 µF, 1 µF, etc. The resistor R2, for example, may have a high resistance such as, for example, a resistance of about 1 kOhm, 10 kOhm, 100 kOhm, 1 MOhm, 10 MOhm, 100 MOhm, etc.

The second lead stage 105 represents circuit elements between the high voltage power system and the load stage 106. The resistor R13, for example, may represent the resistance of the leads or transmission lines that connect from the output of the high voltage power system to the electrode (e.g., the load stage 106). The capacitors C1, for example, may represent stray capacitance in the leads or transmissions line.

In some embodiments, the load stage 106 may represent an idealized or effective circuit for semiconductor processing chamber such as, for example, a plasma deposition system, semiconductor fabrication system, plasma sputtering system, etc. The capacitance C2, for example, may represent the capacitance of the chuck upon which the wafer may sit. The chuck, for example, may comprise a dielectric material. For example, the capacitor C1 may have small capacitance (e.g., about 10 pF, 100 pF, 500 pF, 1 nF, 10 nF, 100 nF, etc.).

The capacitor C3, for example, may represent the sheath capacitance between the plasma and the wafer. The resistor R6, for example, may represent the sheath resistance between the plasma and the wafer. The inductor L2, for example, may represent the sheath inductance between the plasma and the wafer. The current source 12, for example, may be represent the ion current through the sheath. For example, the capacitor C1 or the capacitor C3 may have small capacitance (e.g., about 10 pF, 100 pF, 500 pF, 1 nF, 10 nF, 100 nF, etc.).

The capacitor C9, for example, may represent capacitance within the plasma between a chamber wall and the top surface of the wafer. The resistor R7, for example, may represent resistance within the plasma between a chamber wall and the top surface of the wafer. The current source 11, for example, may be representative of the ion current in the plasma. For example, the capacitor C1 or the capacitor C9 may have small capacitance (e.g., about 10 pF, 100 pF, 500 pF, 1 nF, 10 nF, 100 nF, etc.).

As used in this document the plasma voltage is the voltage measured from ground to circuit point 123; the wafer voltage is the voltage measured from ground to circuit point 122 and may represent the voltage at the surface of the wafer; the chucking voltage is the voltage measured from ground to circuit point 121; the electrode voltage is the voltage measure from ground to circuit point 124; and the input voltage is the voltage measured from ground to circuit point 125.

Figure 2:
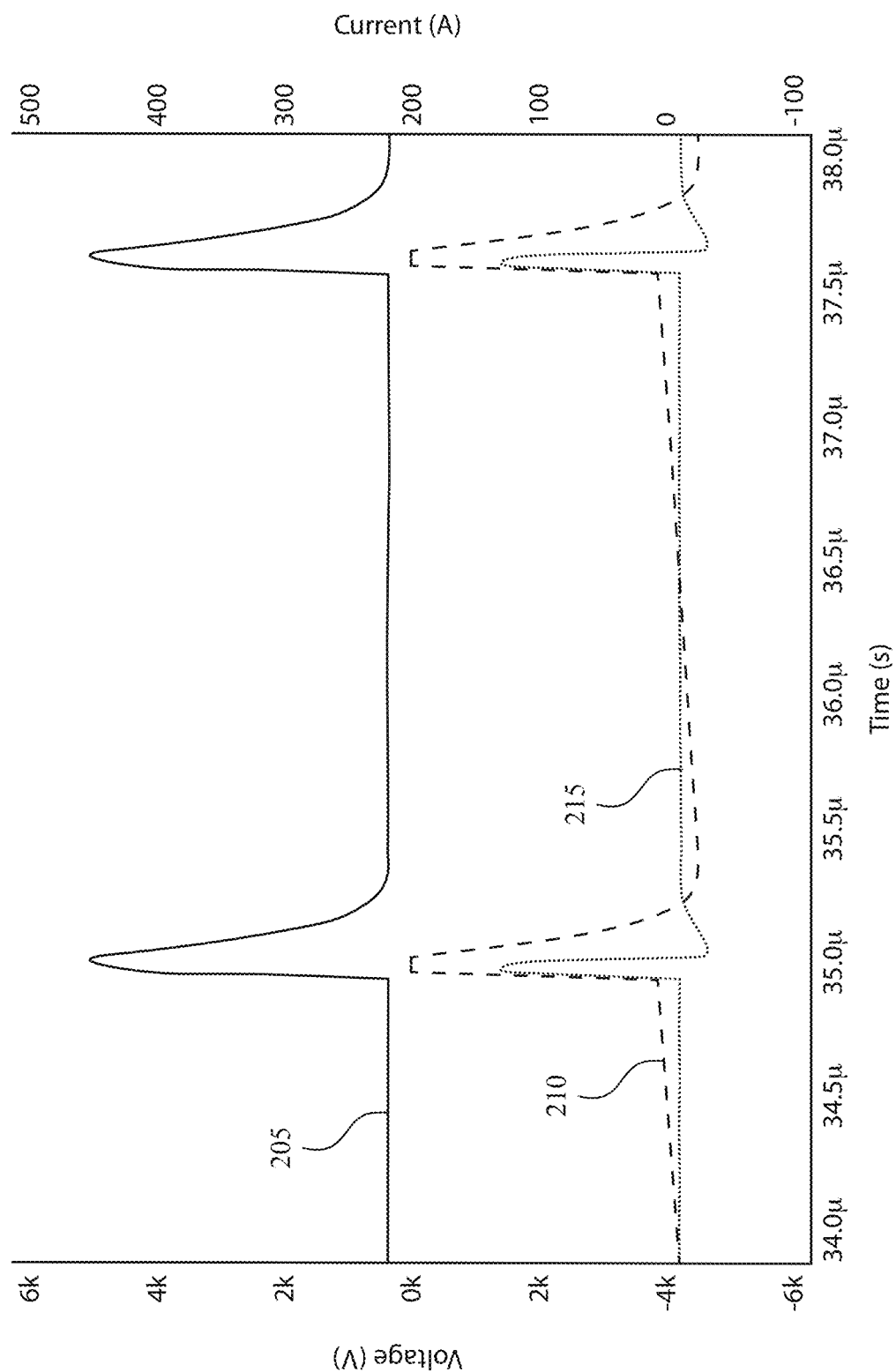
FIG. 2 shows example waveforms produced by a high voltage power system according to some embodiments.

FIG. 2 shows example waveforms produced by the high voltage power system with a plasma load 100. In these example waveforms, the pulse waveform 205 may represent the voltage provided to the load stage 106. As shown, the pulse waveform 205, which is the voltage at circuit point 124, produces a pulse with the following qualities: high voltage (e.g., greater than about 4 kV as shown in the waveform), a fast rise time (e.g., less than about 200 ns as shown in the waveform), a fast fall time (e.g., less than about 200 ns as shown in the waveform), and short pulse width (e.g., less than about 300 ns as shown in the waveform). The waveform 210 may represent the voltage at circuit point 122, for example, at the surface of the wafer. The waveform 215 represent the current flowing through the plasma, for example, the current through inductor L2.

During the transient state (e.g., during an initial number of pulses not shown in the figure), the high voltage pulses from the pulser stage 101 charge the capacitor C2. Because the capacitance of capacitor C2 is large compared to the capacitance of either or both capacitor C3 or capacitor C1, or because of the short pulse widths of the pulses, the capacitor C2 may take a number of pulses from the high voltage pulser to fully charge. Once the capacitor C2 is fully charged the circuit reaches a steady state, as shown by the waveforms in FIG. 2.

In steady state and when the switch S1 is open, the capacitor C2 is charged and slowly dissipates through the resistive output stage 102, as shown by the slightly rising slope of waveform 210. Once the capacitor C2 is charged and while the switch S1 is open, the voltage at the surface of the waver (the point between capacitor C2 and capacitor C3) is negative. This negative voltage may be the negative value of the voltage of the pulses provided by the pulser stage 101. For the example waveform shown in FIG. 2, the voltage of each pulse is about 4 kV; and the steady state voltage at the wafer is about-4 kV. This results in a negative potential across the plasma (e.g., across capacitor C3) that accelerates positive ions from the plasma to the surface of the wafer. While the switch S1 is open, the charge on capacitor C2 slowly dissipates through the resistive output stage.

When the switch S1 is changed from opened to closed, the voltage across the capacitor C2 may flip (the pulse from the pulser is high as shown in waveform 205) as the capacitor C2 is charged. In addition, the voltage at the circuit point 123 (e.g., at the surface of the wafer) changes to about zero as the capacitor C2 charges, as shown in waveform 210. Thus, the pulses from the high voltage pulser can produce a plasma potential (e.g., a potential in the plasma) that rise from a negative high voltage to zero and returns to the negative high voltage at high frequencies, with any or all of fast rise times, fast fall times, or short pulse widths.

In some embodiments, the action of the resistive output stage 102, elements represented by the resistive output stage 102, that may rapidly discharge the stray capacitance C1, and may allow the voltage at the point between capacitor C2 and capacitor C3 to rapidly return to its steady negative value of about-4 kV as shown by waveform 210. The resistive output stage may allow the voltage at the point between capacitor C2 and capacitor C3 to exists for about % of the time, and thus maximizes the time which ions are accelerated into the wafer. In some embodiments, the components contained within the resistive output stage may be specifically selected to optimize the time during which the ions are accelerated into the wafer, and to hold the voltage during this time approximately constant. Thus, for example, a short pulse with fast rise time and a fast fall time may be useful, so there can be a long period of fairly uniform negative potential.

In some embodiments, a bias compensation subsystem can be used to adjust the chucking voltage in a semiconductor fabrication wafer chamber. For instance, a chucking voltage can be applied to the chuck to track that tracks the on/off pattern of the bursts to ensure a constant voltage on the chuck.

In some embodiments, any of the various high voltage power systems may include a resistive output stage disclosed in this document may include any or all components, arrangements, functionality, etc. shown or described in U.S. patent application Ser. No. 15/941,731, titled "High Voltage Resistive Output Stage Circuit" filed on Mar. 30, 2018, which is incorporated in its entirety herein for all purposes.

FIG. 3 is a circuit diagram of a high voltage power system with a plasma load 300 according to some embodiments. The high voltage power system with a plasma load 300 is similar to high voltage power system with a plasma load 100. The pulser stage 110 in this example includes a high voltage switch S1. In some embodiments, the high voltage switch S1 may include a plurality of switches arranged in series to collectively open and close high voltages. For example, the high voltage switch S1 may include the high voltage switch 1500 described in FIG. 15. As another example, the high voltage switch S1 may, for example, include any switch described in U.S. patent application Ser. No. 16/178,565, filed Nov. 1, 2018, titled "High Voltage Switch with Isolated Power," which is incorporated into this disclosure in its entirety for all purposes.

In any embodiment, a pulser stage 101 or pulser stage 110 may be used to produce high voltage pulses. In addition, the pulser stage 101 and the pulser stage 110 may be interchangeable.

In this example, the DC bias circuit 104 does not include any bias compensation.

In some embodiments, the pulser stage 110 may produce pulses with a voltage greater than 1 kV, 10 kV, 20 kV, 50 kV, 100 kV, 1,000 kV, etc., with rise times less than about 1 ns, 10 ns, 50 ns, 100 ns, 250 ns, 500 ns, 1,000 ns, etc. with fall times less than about 1 ns, 10 ns, 50 ns, 100 ns, 250 ns, 500 ns, 1,000 ns, etc. and frequencies greater than about 1 kHz, 10 kHz, 100 kHz, 200 kHz, 500 kHz, 1 MHz, etc.

In some embodiments, the pulser stage 101 may include a radio-frequency power supply such as, for example, an RF generator.

Figure 4:
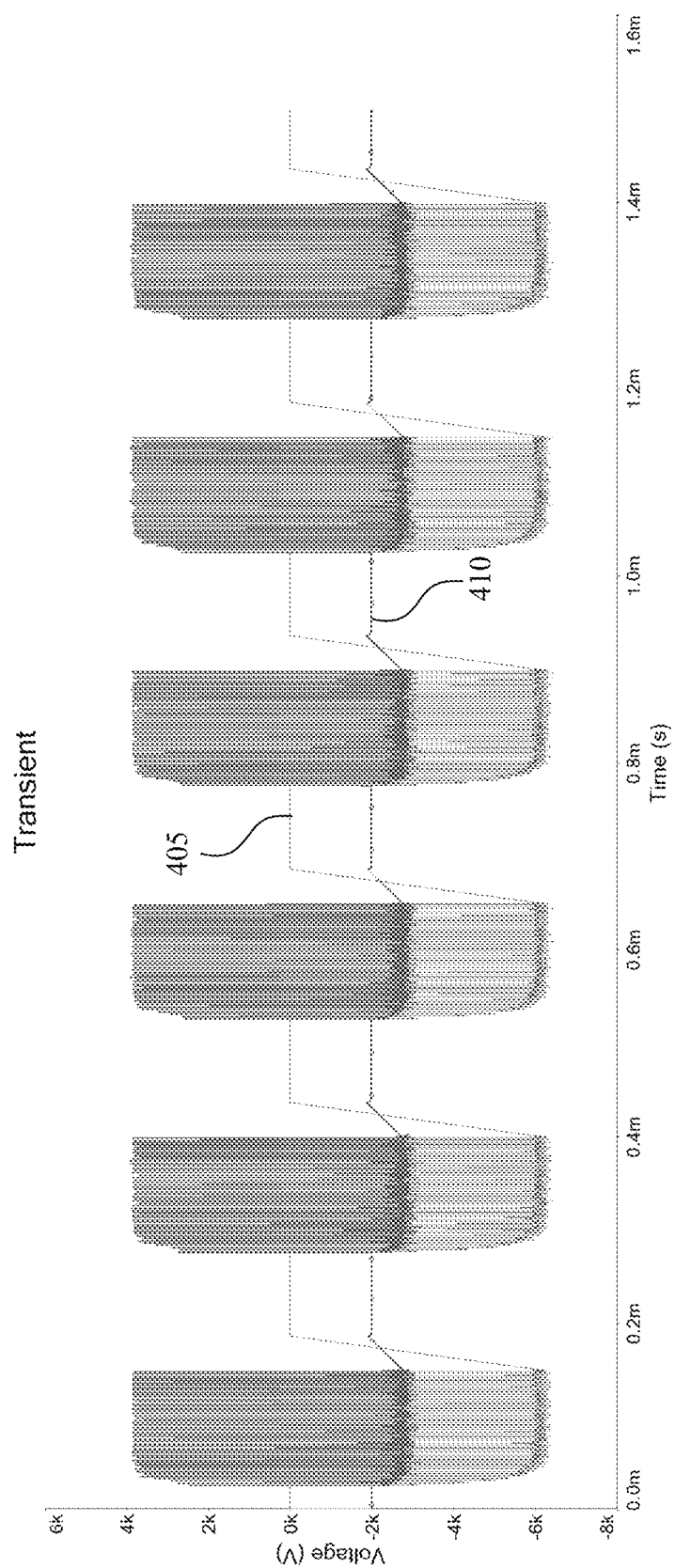
FIG. 4 shows example waveforms produced by a high voltage power system according to some embodiments.

FIG. 4 shows example waveforms produced by a high voltage power system (e.g., high voltage power system with a plasma load 100 or high voltage power system with a plasma load 300). The wafer waveform 405 represents the voltage on the wafer and chuck waveform 410 is the voltage on the chuck. The wafer waveform 405 is measured at the position labeled 122 on the circuit diagram in FIG. 3. The chuck waveform 410 is measured at the position labeled 121 on the circuit diagram in FIG. 3. As shown, during pulsing, the difference between the chuck waveform 410 and the wafer waveform 405 is about 4 kV. With peak voltages above 2 kV, this may cause damage to the wafer on the chuck within a chamber.

The waveforms in FIG. 4 show six burst of about 10 seconds with a plurality of pulse within each burst.

Figure 5:
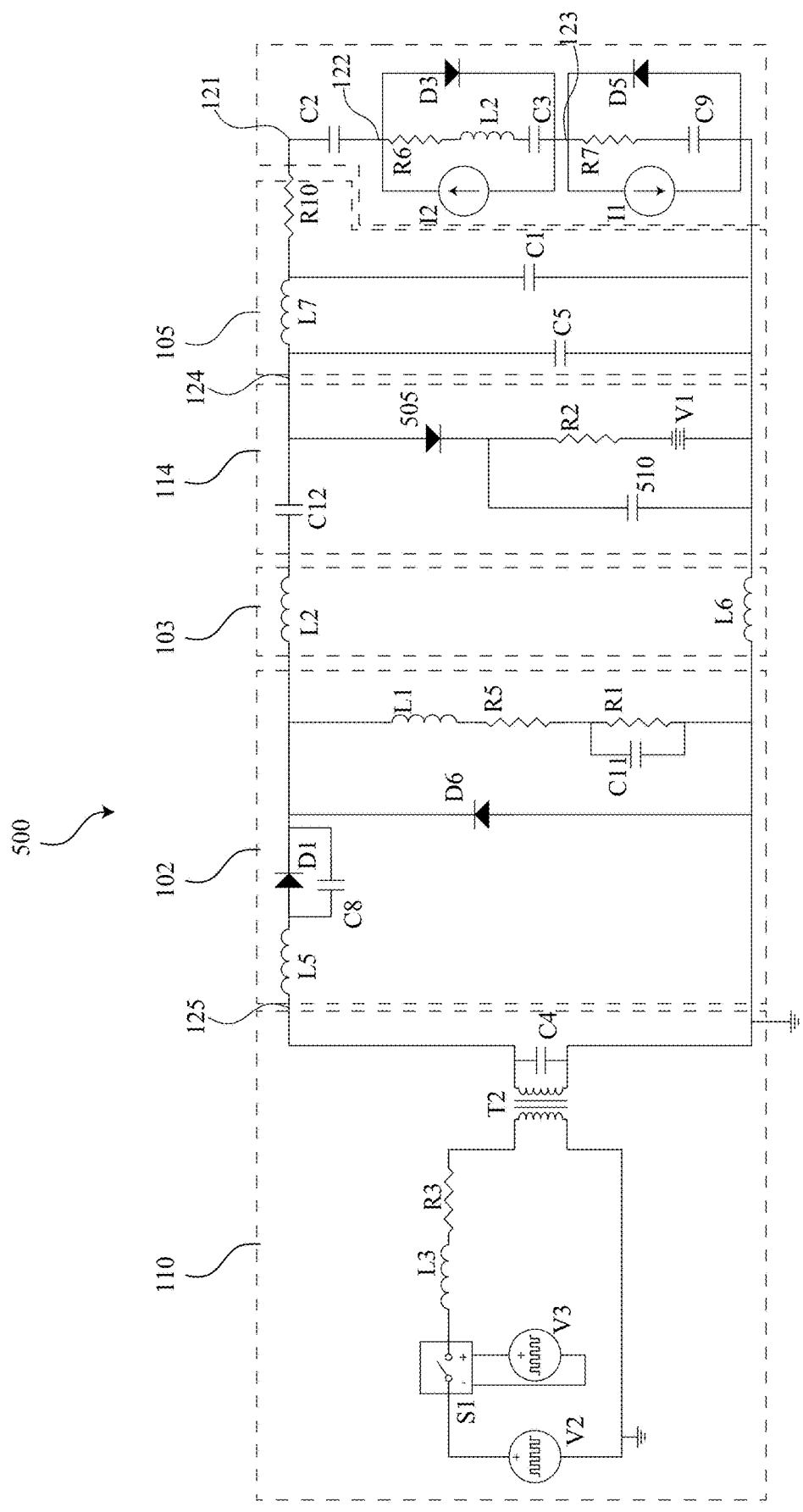
FIG. 5 is a circuit diagram of a high voltage power system with a plasma load according to some embodiments.

FIG. 5 is a circuit diagram of a high voltage power system with a plasma load 500 according to some embodiments. The high voltage power system with the plasma load 500 is similar to the high voltage power system with a plasma load 300.

In this example, the bias compensation circuit 114 is a passive bias compensation circuit and can include a bias compensation diode 505 and a bias compensation capacitor 510. The bias compensation diode 505 can be arranged in series with offset supply voltage V1. The bias compensation capacitor 510 can be arranged across either or both the offset supply voltage V1 and the resistor R2. The bias compensation capacitor 510 can have a capacitance less than 100 nF to 100 μF such as, for example, about 100 μF, 50 μF, 25 μF, 10 μF, 2 μF, 500 nF, 200 nF, etc.

In some embodiments, the bias compensation diode 505 can conduct currents of between 10 A and 1 kA at a frequency of between 10 Hz and 10 kHz.

In some embodiments, the bias capacitor C12 may allow for a voltage offset between the output of the pulser stage 101 (e.g., at the position labeled 125) and the voltage on the electrode (e.g., at the position labeled 124). In operation, the electrode may, for example, be at a DC voltage of −2 kV during a burst, while the output of the nanosecond pulser alternates between +6 kV during pulses and 0 kV between pulses.

The bias capacitor C12, for example, 100 nF, 10 nF, 1 nF, 100 μF, 10 μF, 1 μF, etc. The resistor R2, for example, may have a high resistance such as, for example, a resistance of about 1 kOhm, 10 kOhm, 100 kOhm, 1 MOhm, 10 MOhm, 100 MOhm, etc.

In some embodiments, the bias compensation capacitor 510 and the bias compensation diode 505 may allow for the voltage offset between the output of the pulser stage 101 (e.g., at the position labeled 125) and the voltage on the electrode (e.g., at the position labeled 124) to be established at the beginning of each burst, reaching the needed equilibrium state. For example, charge is transferred from capacitor C12 into capacitor 510 at the beginning of each burst, over the course of a plurality of pulses (e.g., maybe about 5-100), establishing the correct voltages in the circuit.

Figure 6:
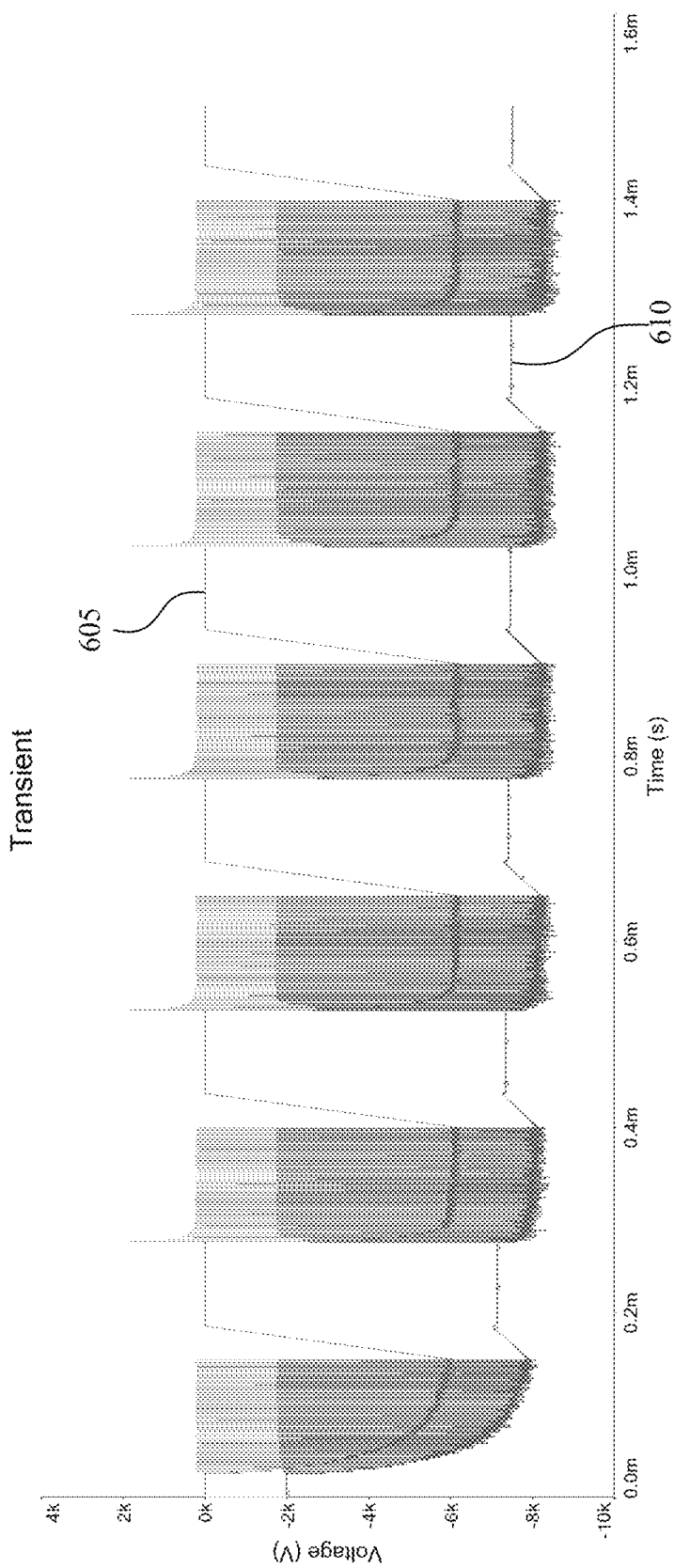
FIG. 6 shows example waveforms produced by a high voltage power system according to some embodiments.

FIG. 6 shows example waveforms produced by the high voltage power system with the plasma load 500. As shown in the figure, the voltage bias between the wafer waveform 605 and the chuck waveform 610 stays fixed during pulse burst but stays charged after the burst. In this example, the difference between the wafer waveform 605 and the chuck waveform 610 during pulsing is less than about 2 kV, which may be within acceptable tolerances. In this example, however, the difference between the wafer waveform 605 and the chuck waveform 610 between pulses is greater than about 7 kV, which may not be within acceptable tolerances.

The waveforms in FIG. 6 show six burst of about 10 seconds with a plurality of pulse within each burst.

Figure 7:
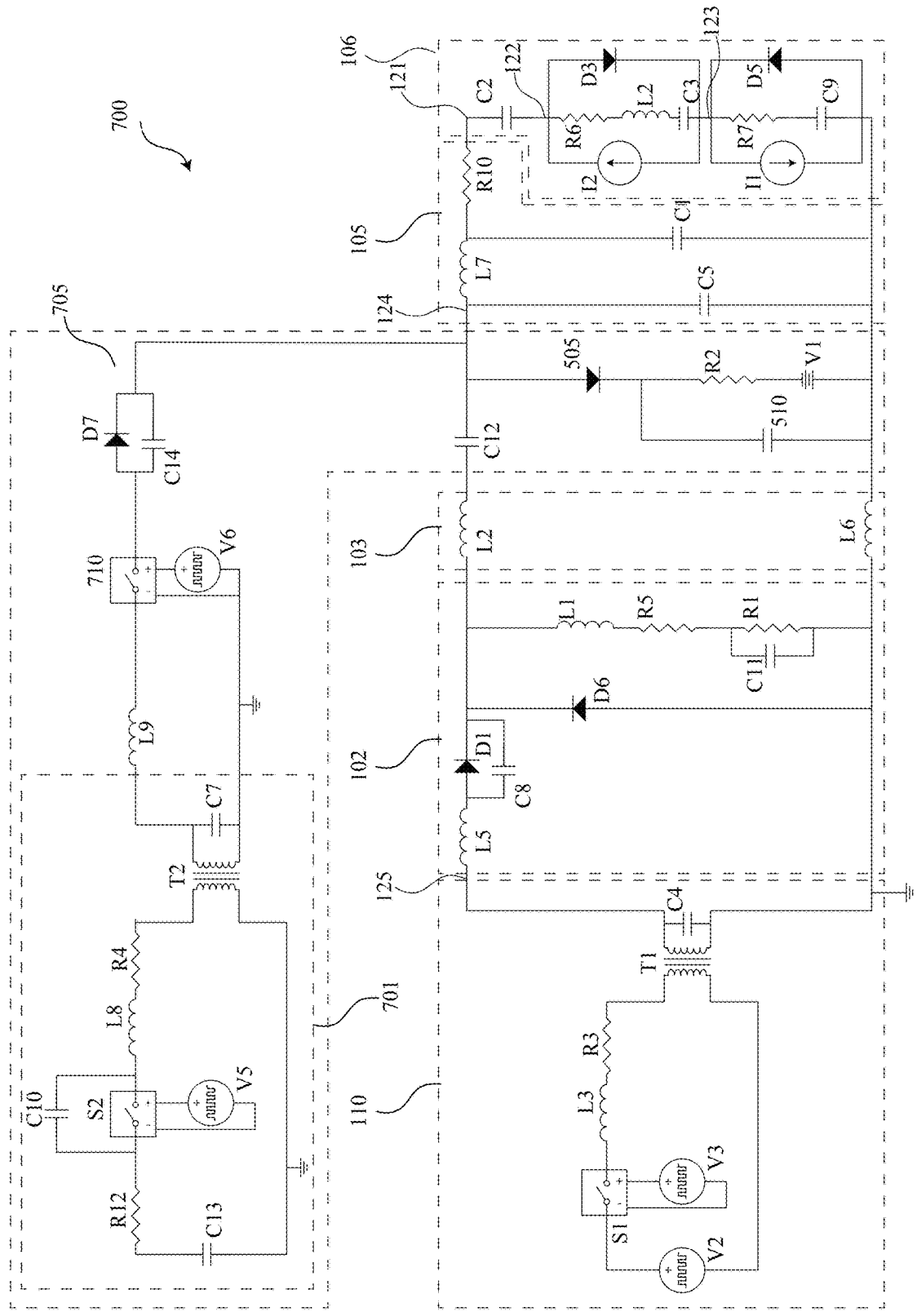
FIG. 7 is a circuit diagram of a high voltage power system with a plasma load according to some embodiments.

FIG. 7 is a circuit diagram of a high voltage power system with a plasma load 700 according to some embodiments. The high voltage power system with a plasma load 700 is similar to high voltage power system with the plasma load 500, and includes a second pulser circuit 705.

The second pulser circuit 705 may include the bias compensation circuit 114 or components similar to the bias compensation circuit 114.

The second pulser circuit 705, can include a second pulser 701. The second pulser 701, for example, may include one or more or all the components of the pulser stage 110 shown in either FIG. 1 or FIG. 3. For example, the pulser stage 110 may include a nanosecond pulser or a high voltage switch as disclosed in this document (e.g., FIG. 15 and related paragraphs). In some embodiments, the second pulser 701 may be configured to turn off when the pulser stage 101 is pulsing (e.g., during bursts), and the second pulser 701 may be configured to turned on when the pulser stage 101 is not pulsing (e.g., in between bursts)

The second pulser circuit 705 may also include inductor L9 on the secondary side of the transformer T2 and switch 710 may be coupled with voltage source V6. The inductor L9 may represent the stray inductance of the second pulser circuit 705 and may have a low inductance such as, for example, an inductance less than about 500 nH, 250 nH, 100 nH, 50 nH, 25 nH, etc. In some embodiments, the voltage source V6 may represent a trigger for the switch 710.

In some embodiments, the second pulser circuit 705 may include the blocking diode D7. The blocking diode D7, for example, may ensure current flows from the switch 710 to the load stage 106. The capacitor C14, for example, may represent the stray capacitance of the blocking diode D7. The capacitance of capacitor C14, for example, may have a low capacitance such as, for example, less than about 1 nF, 500 pF, 200 pF, 100 pF, 50 pF, 25 pF, etc.

In some embodiments, the switch 710 may be open while the pulser stage 110 is pulsing and closed when the pulser stage 110 is not pulsing to offset (or bias) the voltage provided by the pulser stage.

In some embodiments, the switch 710 may include a plurality of switches arranged in series to collectively open and close high voltages. In some embodiments, the switch 710 may include the high voltage switch 1500 described in FIG. 15. As another example, the high voltage switch 905 may, for example, include any switch described in U.S. patent application Ser. No. 16/178,565, filed Nov. 1, 2018, titled "High Voltage Switch with Isolated Power," which is incorporated into this disclosure in its entirety for all purposes.

Figure 8:
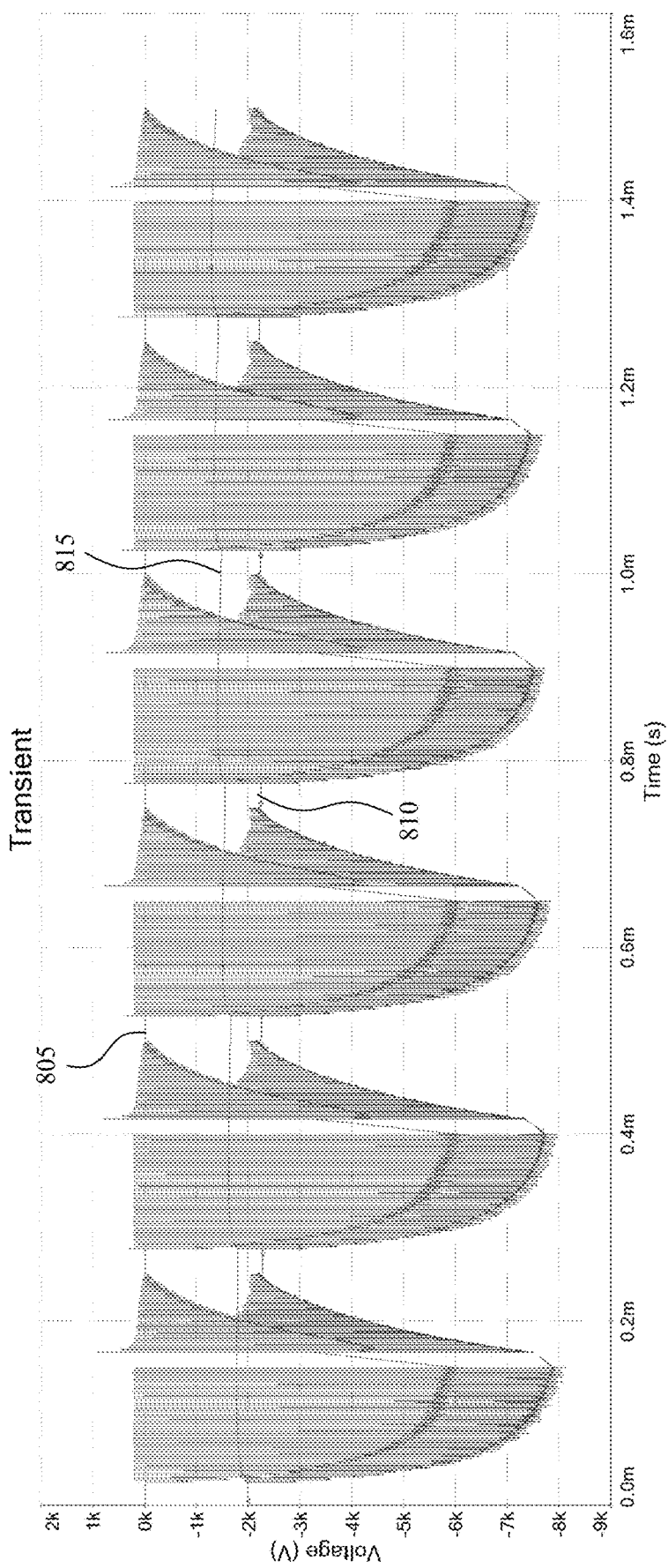
FIG. 8 shows example waveforms produced by a high voltage power system according to some embodiments.

FIG. 8 shows example waveforms produced by the high voltage power system with a plasma load 700. The wafer waveform 805 represents the voltage on the wafer and chuck waveform 810 is the voltage on the chuck. The wafer waveform 805 is measured at wafer which is indicated by the position labeled 122 on the circuit diagram in FIG. 7. The chuck waveform 810 is measured at the chuck which is indicated by the position 121 on the circuit diagram in FIG. 7. The bias waveform 815 is measured at the position labeled 124 on the circuit diagram in FIG. 7. In this example, the bias capacitor 510 is discharging and may require the second pulser circuit 705 to include a higher power supply than V2, for example, in order to recharge the bias capacitor, which may require several kilowatts of power.

The waveforms in FIG. 8 show six burst of about 10 seconds with a plurality of pulse within each burst.

Figure 9:
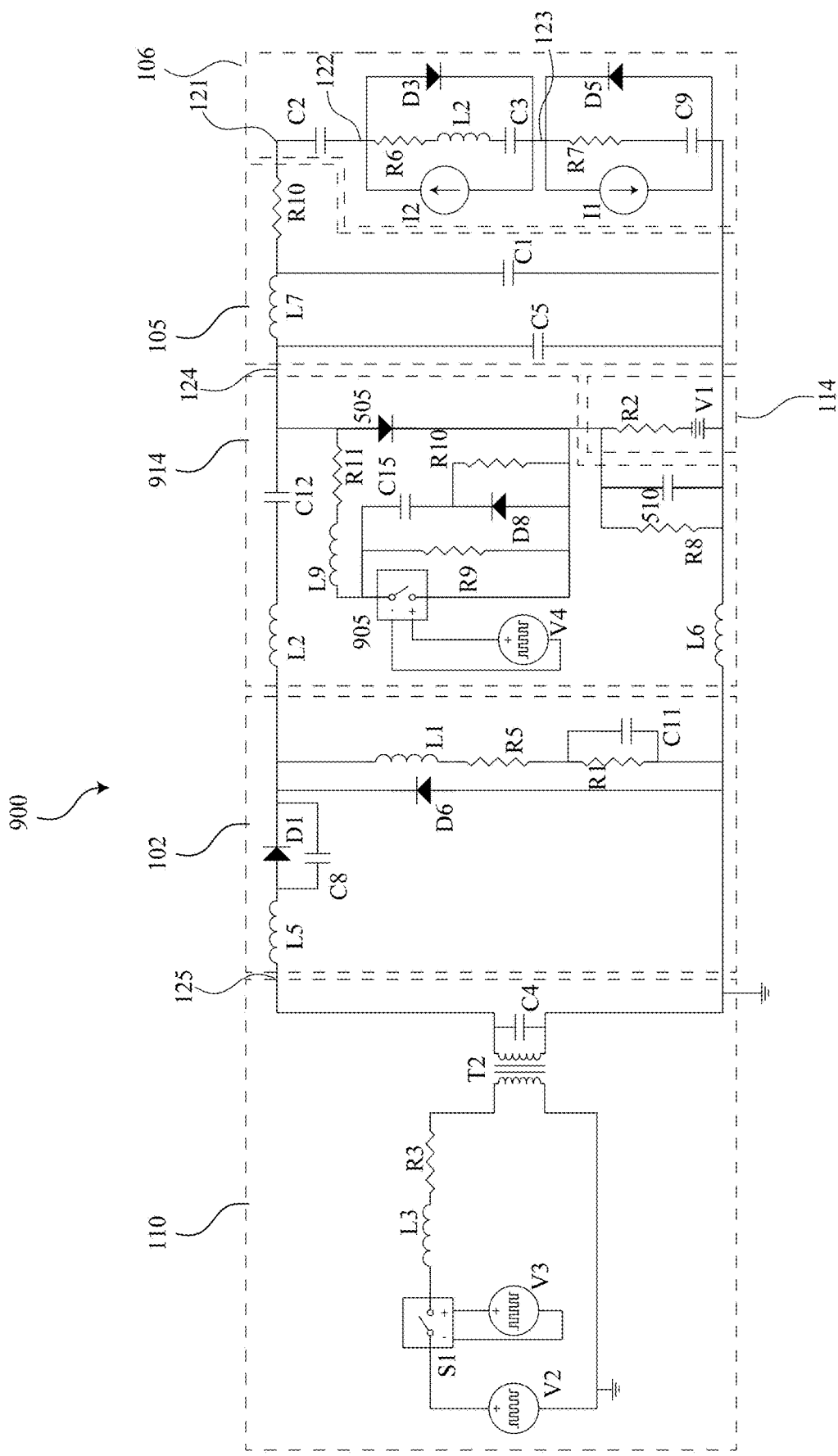
FIG. 9 is a circuit diagram of a high voltage power system with a plasma load according to some embodiments.

FIG. 9 is a circuit diagram of a high voltage power system with a plasma load 900 according to some embodiments. The high voltage power system with a plasma load 500 is similar to high voltage power system with a plasma load 900.

In this embodiment, the bias compensation circuit 914, can include a high voltage switch 905 coupled across the bias compensation diode 505 and coupled with power supply V1. In some embodiments, the high voltage switch 905 may include a plurality of switches 905 arranged in series to collectively open and close high voltages. For example, the high voltage switch 905 may include the high voltage switch 1500 described in FIG. 15. In some embodiments, the high voltage switch 905 may be coupled with a switch trigger V4.

The high voltage switch 905 may be coupled in series with either or both an inductor L9 and a resistor R11. The inductor L9 may limit peak current through high voltage switch 905. The inductor L9, for example, may have an inductance less than about 100 μH such as, for example, about 250 μH, 100 μH, 50 μH, 25 μH, 10 μH, 5 μH, 1 μH, etc. The resistor R11, for example, may shift power dissipation to the resistive output stage 102. The resistance of resistor R11, for example, may have a resistance of less than about 1,000 ohms, 500 ohms, 250 ohms, 100 ohms, 50 ohms, 10 ohms, etc.

In some embodiments, the high voltage switch 905 may include a snubber circuit. The snubber circuit may include resistor R9, snubber diode D8, snubber capacitor C15, and snubber resistor R10.

In some embodiments, the resistor R8 can represent the stray resistance of the offset supply voltage V1. The resistor R8, for example, may have a high resistance such as, for example, a resistance of about 10 kOhm, 100 kOhm, 1 MOhm, 10 MOhm, 100 MOhm, 1 GOhm, etc.

In some embodiments, the high voltage switch 905 may include a plurality of switches arranged in series to collectively open and close high voltages. For example, the high voltage switch 905 may include the high voltage switch 1500 described in FIG. 15. As another example, the high voltage switch 905 may, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, the high voltage switch 905 may be open while the pulser stage 110 is pulsing and closed when the pulser stage 110 is not pulsing. When the high voltage switch 905 is closed, for example, current can short across the bias compensation diode 505. Shorting this current may allow the bias between the wafer and the chuck to be less than 2 kV, which may be within acceptable tolerances.

In some embodiments, the high voltage switch 905 can allow the electrode voltage (the position labeled 124) and the wafer voltage (the position labeled 122) to be quickly restored (e.g., less than about 100 ns, 200 ns, 500 ns, 1 μs) to the chucking potential (the position labeled 121). This is shown, for example, in FIGS. 10, 11A, and 11B.

Figure 10:
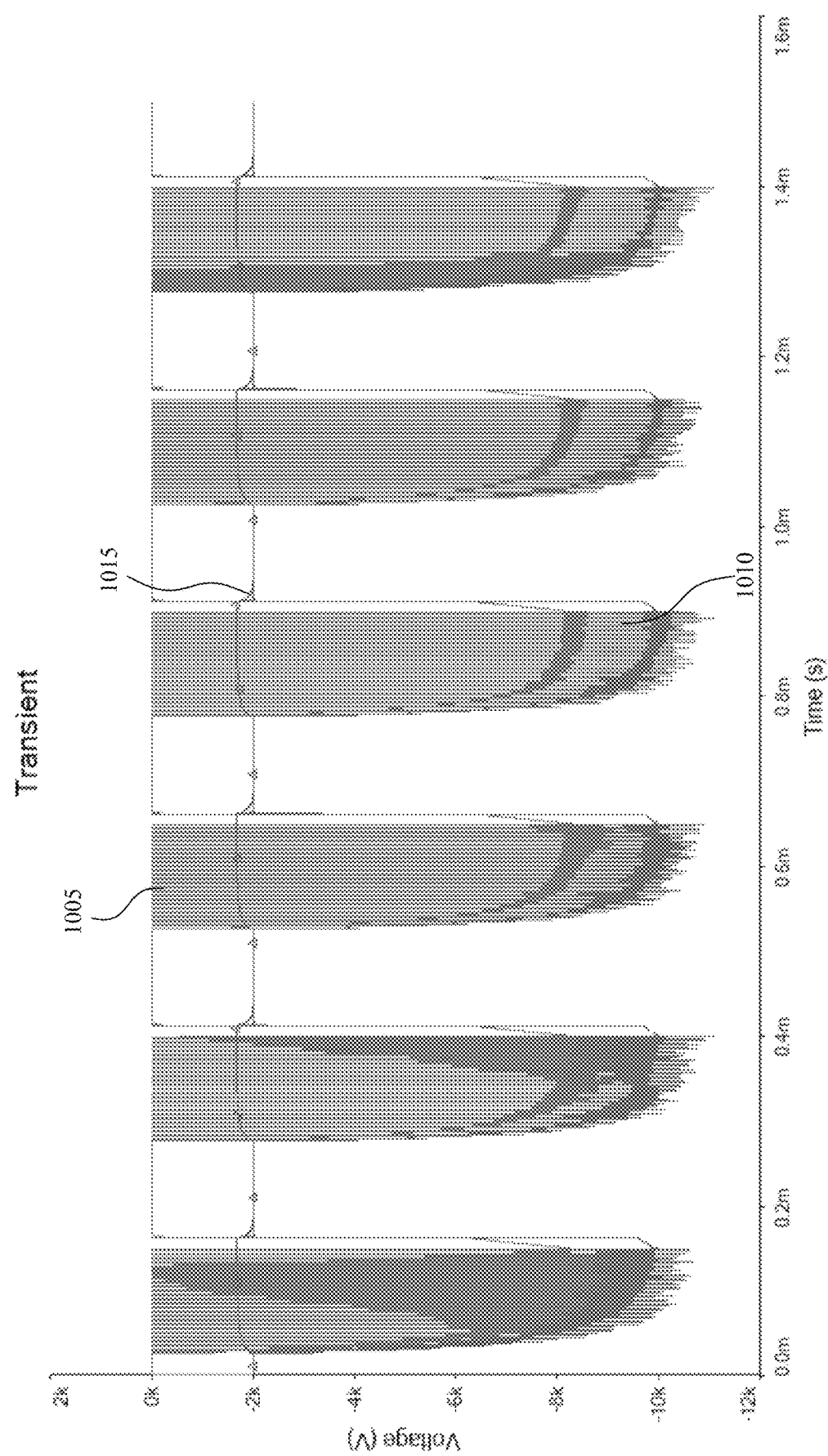
FIG. 10 shows example waveforms from a high voltage power system according to some embodiments.

FIG. 10 shows example waveforms produced by the high voltage power system with a plasma load 900 according to some embodiments. The wafer waveform 1005 represents the voltage on the wafer, the chuck waveform 1010 represents the voltage on the chuck, and the bias waveform 1015 represents the voltage from the bias compensation circuit 114. The wafer waveform 1005 is measured at the position labeled 122 on the circuit diagram in FIG. 9. The chuck waveform 1010 is measured at the position labeled 121 on the circuit diagram in FIG. 9. The bias waveform 1015 is measured at the position labeled 124 on the circuit diagram in FIG. 9.

The waveforms in FIG. 10 show six burst of about 10 seconds with a plurality of pulse within each burst.

Figure 11A:
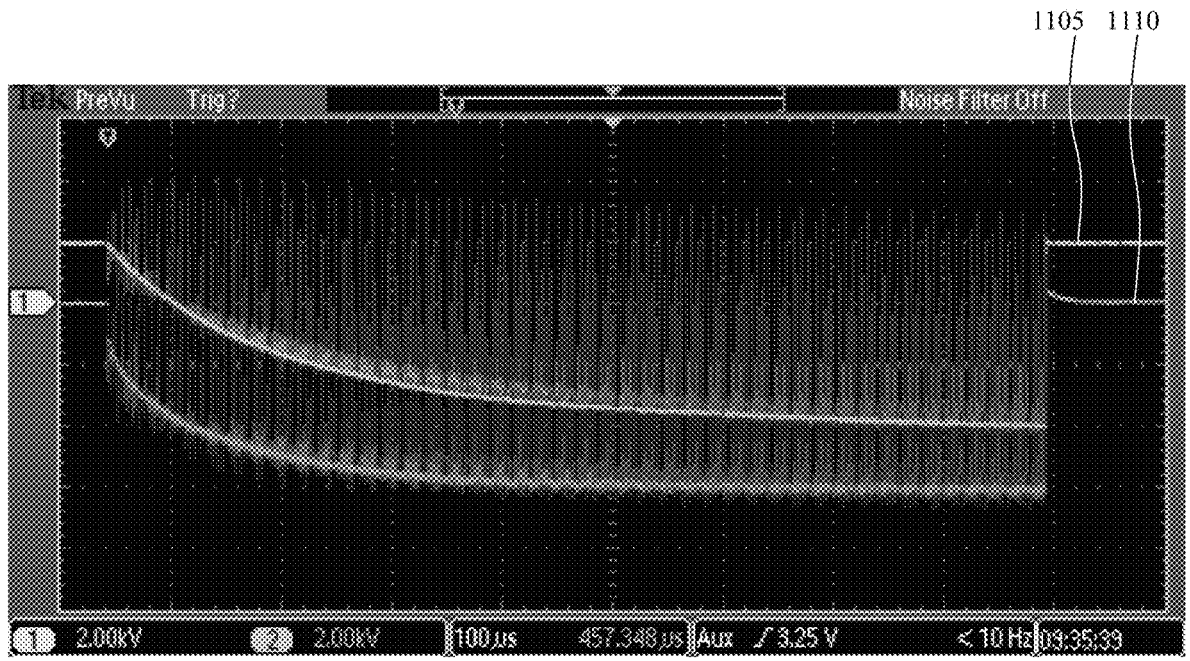
FIG. 11A shows example waveforms from a high voltage power system according to some embodiments.
Figure 11B:
FIG. 11B shows example waveforms from a high voltage power system according to some embodiments.

FIG. 11A and FIG. 11B show example waveforms from a high voltage power system with a plasma load 900 according to some embodiments. FIG. 11A shows a single burst having 340 pulses and FIG. 11B shows a few pulses within a burst. The waveform 1105 shows the voltage at the electrode (the position labeled 124 in FIG. 9) and the waveform 1110 shows the voltage at the wafer (the position labeled 122 in FIG. 9). Note that the voltages on the electrode and wafer tend to track with a constant offset of about 2 kV. The waveforms also show how the voltages return to DC value while the pulser is off until the next burst begins some time later.

Figure 12:
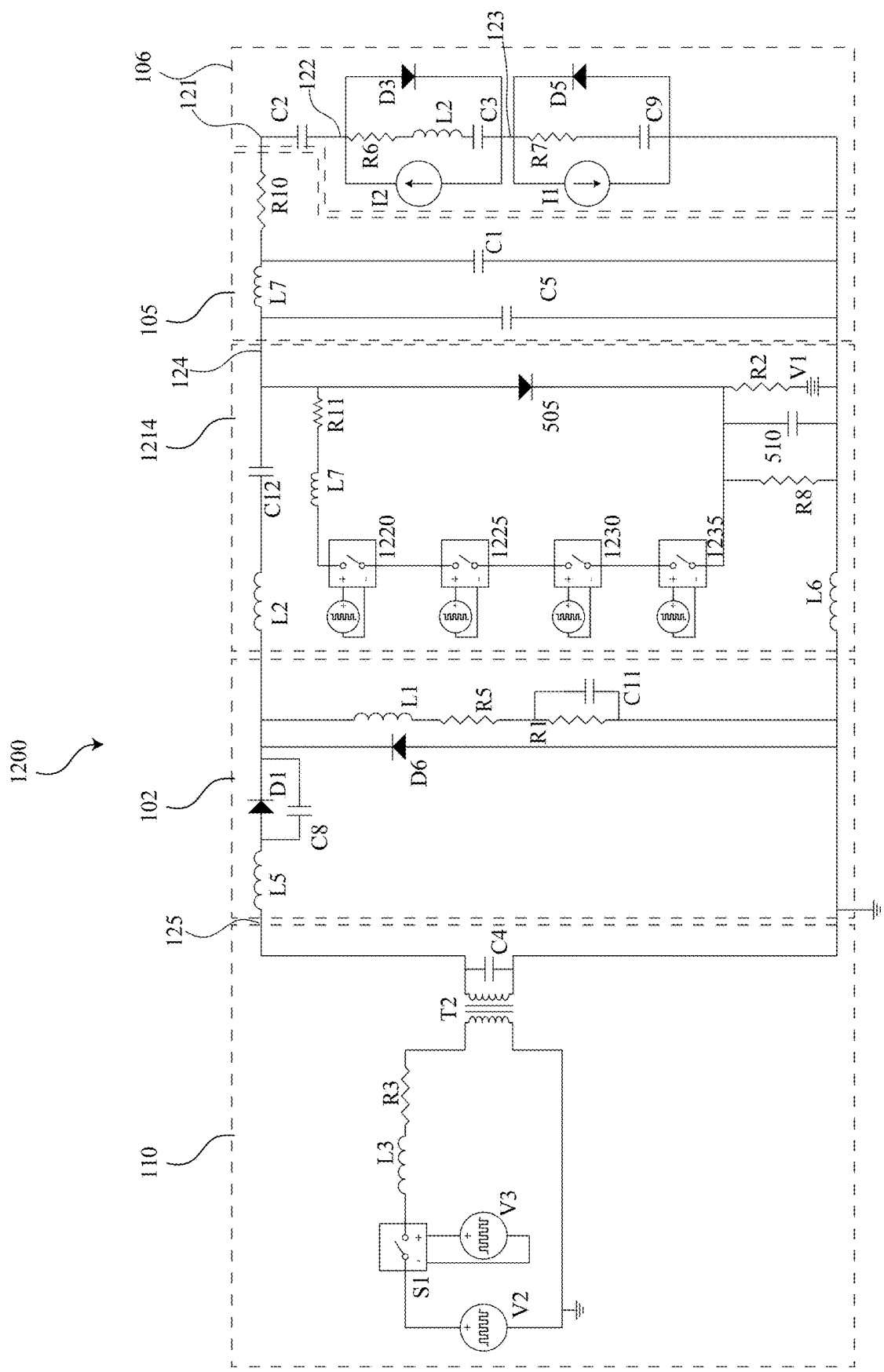
FIG. 12 is a circuit diagram of a high voltage power system with a plasma load according to some embodiments.

FIG. 12 is a circuit diagram of a high voltage power system with a plasma load 1200 according to some embodiments. The high voltage power system with a plasma load 1200 is similar to high voltage power system with a plasma load 900.

In some embodiments, the bias compensation circuit 1214, can include a four high voltage switch stages (including switches 1220, 1225, 1230, and 1235) arranged across or in parallel with the bias compensation diode 505. Each switch stage includes a switch (e.g., switches 1220, 1225, 1230, and 1235) and a voltage sharing resistor (e.g., resistor R15, R16, R17, and R18). Either or both the resistor R11 and the inductor L7 are arranged in series with the switch stages. The inductor L9, for example, may have an inductance less than about 100 μH such as, for example, about 1 mH, 500 μH, 250 μH, 100 μH, 50 μH, 25 μH, 10 μH, 5 μH, 1 μH, etc. In some embodiments, the switches 1220, 1225, 1230, and 1235 may be open while the pulser stage 110 is pulsing and closed when the pulser stage 110 is not pulsing. When the switches 1220, 1225, 1230, and 1235 are closed, for example, current can short across the bias compensation diode 505. Shorting this current may allow the bias between the wafer and the chuck to be less than 2 kV, which may be within acceptable tolerances.

Each switch 1220, 1225, 1230, and 1235 may include a plurality of switches arranged in series to collectively open and close high voltages. For example, each switch 1220, 1225, 1230, and 1235 may collectively or individually, for example, include the high voltage switch 1500 described in FIG. 15. As another example, each switch 1220, 1225, 1230, and 1235 may collectively or individually, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, the voltage sharing resistors (e.g., resistor R15, R16, R17, and R18) may have a high resistance such as, for example, a resistance of about 1 kOhm, 10 kOhm, 100 kOhm, 1 MOhm, 10 MOhm, 100 MOhm, etc In this example, four high voltage switch stages are shown, any number of high voltage switch stages may be used.

Figure 13:
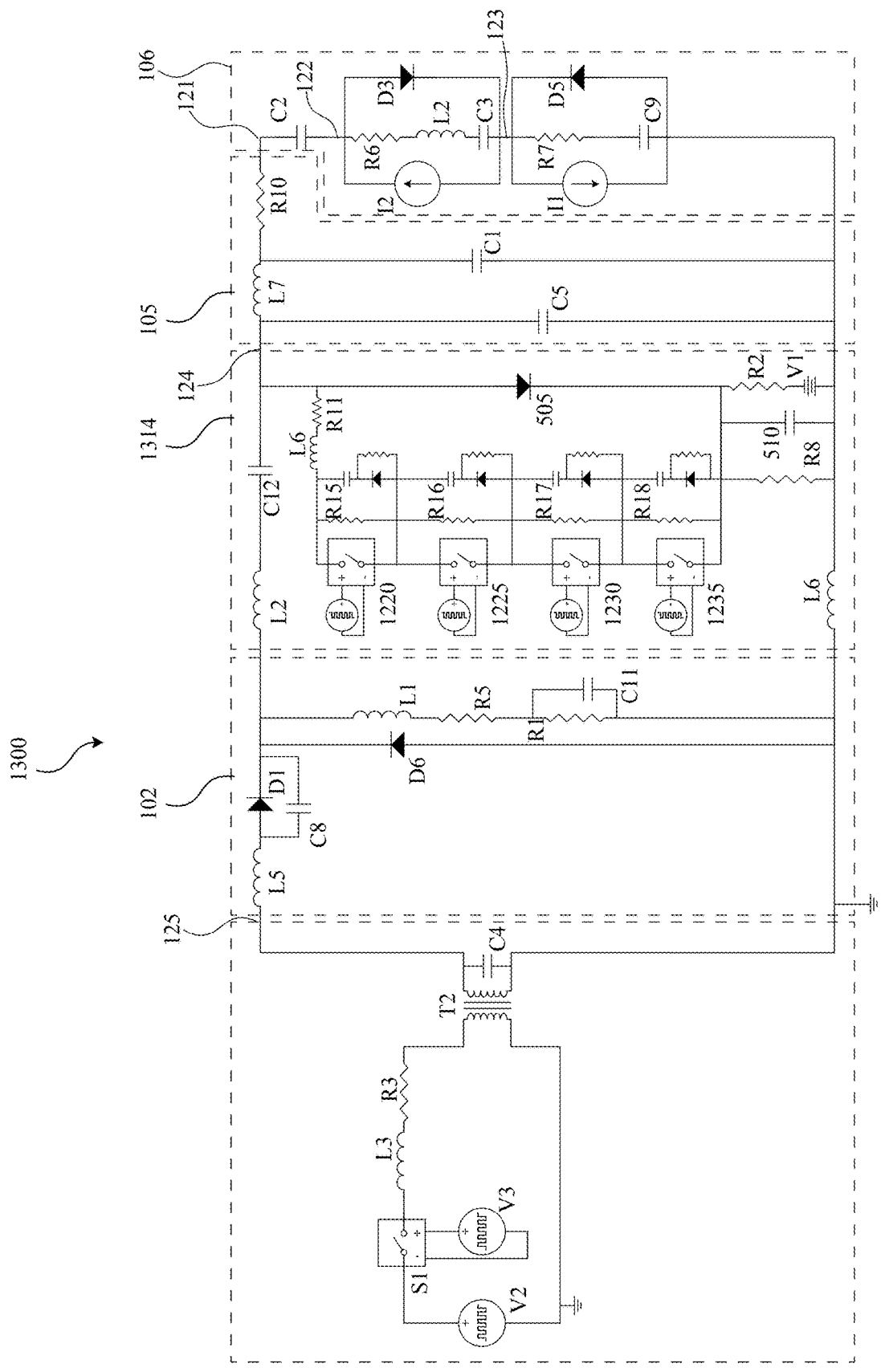
FIG. 13 is a circuit diagram of a high voltage power system with a plasma load according to some embodiments. Snubbers and voltage division resistors

FIG. 13 is a circuit diagram of a high voltage power system with a plasma load 1300 according to some embodiments. The high voltage power system with a plasma load 1300 is similar to high voltage power system with a plasma load 1200.

In this example, the bias compensation circuit 1314 is similar to the bias compensation circuit 1214. In this example, each switch module (1220, 1225, 1230, and 1235) with the bias compensation circuit 1314 may include a corresponding snubber circuit. Each snubber circuit can include a snubber diode and a snubber capacitor. In some embodiments, the snubber diode may include a snubber resistor arranged across the snubber diode. Each switch module may include a resistor which may ensure that the voltage is shared evenly between each of the switches arranged in series.

Figure 14:
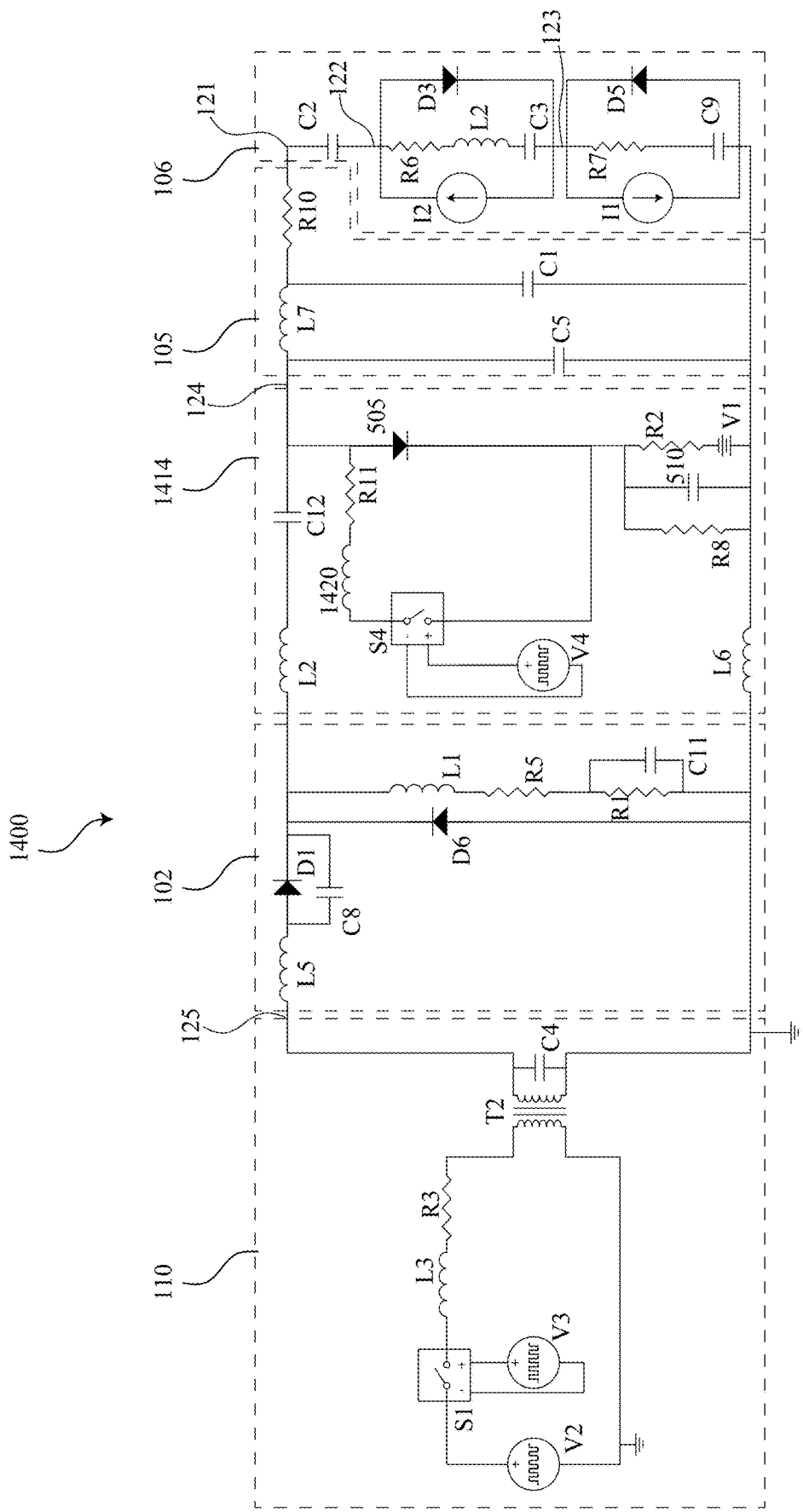
FIG. 14 is a circuit diagram of a high voltage power system according to some embodiments.

FIG. 14 is a circuit diagram of a high voltage power system with a plasma load 1400 according to some embodiments. The high voltage power system with a plasma load 1400 is similar to high voltage power system with a plasma load 900. In this example, the bias compensation circuit 1414 does not include a snubber circuit. In this example, the bias compensation circuit 1414 includes a bias compensation inductor 1420 that is arranged in series with the switch S4. The inductor 1420 may have an inductance less than about 300 nH, 100 nH, 10 nH, 1 nH, etc.

Figure 15:
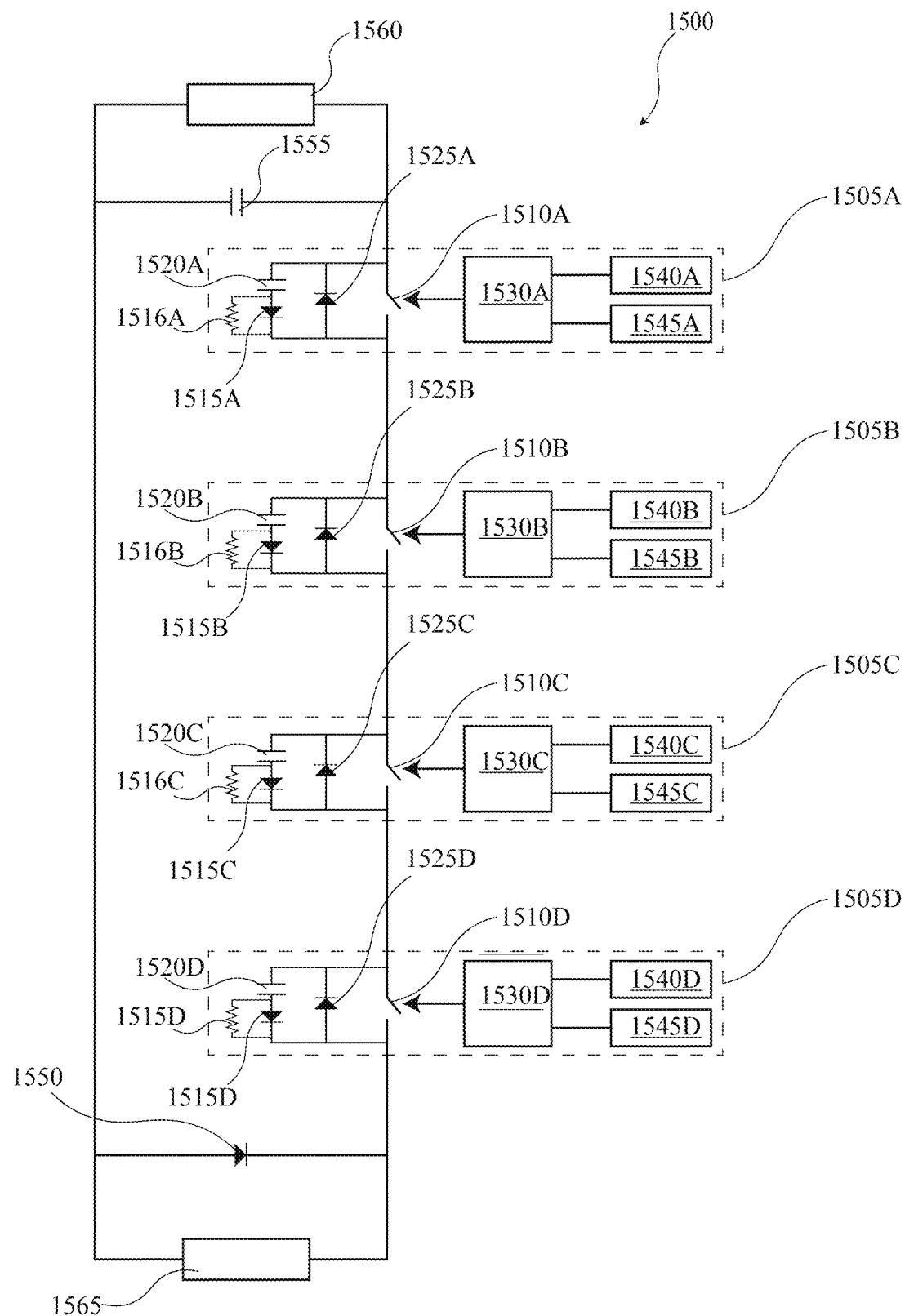
FIG. 15 is a block diagram of a high voltage switch with isolated power according to some embodiments.

In some embodiments, the switch S4 may include the high voltage switch 1500 described in FIG. 15. As another example, the switch S4 may, for example, include any switch described in U.S. patent application Ser. No. 16/178, 565, filed Nov. 1, 2018, titled "High Voltage Switch with Isolated Power," which is incorporated into this disclosure in its entirety for all purposes.

FIG. 15 is a block diagram of a high voltage switch 1500 with isolated power according to some embodiments. The high voltage switch 1500 may include a plurality of switch modules 1505 (collectively or individually 1505, and individually 1505A, 1505B, 1505C, and 1505D) that may switch voltage from a high voltage source 1560 with fast rise times and/or high frequencies and/or with variable pulse widths. Each switch module 1505 may include a switch 1510 such as, for example, a solid state switch.

In some embodiments, the switch 1510 may be electrically coupled with a gate driver circuit 1530 that may include a power supply 1540 and/or an isolated fiber trigger 1545 (also referred to as a gate trigger or a switch trigger). For example, the switch 1510 may include a collector, an emitter, and a gate (or a drain, a source, and a gate) and the power supply 1540 may drive the gate of the switch 1510 via the gate driver circuit 1530. The gate driver circuit 1530 may, for example, be isolated from the other components of the high voltage switch 1500.

In some embodiments, the power supply 1540 may be isolated, for example, using an isolation transformer. The isolation transformer may include a low capacitance transformer. The low capacitance of the isolation transformer may, for example, allow the power supply 1540 to charge on fast time scales without requiring significant current. The isolation transformer may have a capacitance less than, for example, about 100 pF. As another example, the isolation transformer may have a capacitance less than about 30-100 pF. In some embodiments, the isolation transformer may provide voltage isolation up to 1 kV, 5 kV, 10 kV, 25 kV, 50 kV, etc.

In some embodiments, the isolation transformer may have a low stray capacitance. For example, the isolation transformer may have a stray capacitance less than about 1,000 pF, 100 pF, 10 pF, etc. In some embodiments, low capacitance may minimize electrical coupling to low voltage components (e.g., the source of the input control power) and/or may reduce EMI generation (e.g., electrical noise generation). In some embodiments, the transformer stray capacitance of the isolation transformer may include the capacitance measured between the primary winding and secondary winding.

In some embodiments, the isolation transformer may be a DC to DC converter or an AC to DC transformer. In some embodiments, the transformer, for example, may include a 110 V AC transformer. Regardless, the isolation transformer can provide isolated power from other components in the high voltage switch 1500. In some embodiments, the isolation may be galvanic, such that no conductor on the primary side of the isolation transformer passes through or makes contact with any conductor on the secondary side of the isolation transformer.

In some embodiments, the transformer may include a primary winding that may be wound or wrapped tightly around the transformer core. In some embodiments, the primary winding may include a conductive sheet that is wrapped around the transformer core. In some embodiments, the primary winding may include one or more windings.

In some embodiments, a secondary winding may be wound around the core as far from the core as possible. For example, the bundle of windings comprising the secondary winding may be wound through the center of the aperture in the transformer core. In some embodiments, the secondary winding may include one or more windings. In some embodiments, the bundle of wires comprising the secondary winding may include a cross section that is circular or square, for example, to minimize stray capacitance. In some embodiments, an insulator (e.g., oil or air) may be disposed between the primary winding, the secondary winding, or the transformer core.

In some embodiments, keeping the secondary winding far from the transformer core may have some benefits. For example, it may reduce the stray capacitance between the primary side of the isolation transformer and secondary side of the isolation transformer. As another example, it may allow for high voltage standoff between the primary side of the isolation transformer and the secondary side of the isolation transformer, such that corona and/or breakdown is not formed during operation.

In some embodiments, spacings between the primary side (e.g., the primary windings) of the isolation transformer and the secondary side of the isolation transformer (e.g., the secondary windings) can be about 0.1", 0.5", 1", 5", or 10". In some embodiments, typical spacings between the core of the isolation transformer and the secondary side of the isolation transformer (e.g., the secondary windings) can be about 0.1", 0.5", 1", 5", or 10". In some embodiments, the gap between the windings may be filled with the lowest dielectric material possible such as, for example, vacuum, air, any insulating gas or liquid, or solid materials with a relative dielectric constant less than 3.

In some embodiments, the power supply 1540 may include any type of power supply that can provide high voltage standoff (isolation) or have low capacitance (e.g., less than about 1,000 pF, 100 pF, 10 pF, etc.). In some embodiments, the control voltage power source may supply 1520 V AC or 240 V AC at 60 Hz.

In some embodiments, each power supply 1540 may be inductively electrically coupled with a single control voltage power source. For example, the power supply 1540A may be electrically coupled with the power source via a first transformer; the power supply 1540B may be electrically coupled with the power source via a second transformer; the power supply 1540C may be electrically coupled with the power source via a third transformer; and the power supply 1540D may be electrically coupled with the power source via a fourth transformer. Any type of transformer, for example, may be used that can provide voltage isolation between the various power supplies.

In some embodiments, the first transformer, the second transformer, the third transformer, and the fourth transformer may comprise different secondary winding around a core of a single transformer. For example, the first transformer may comprise a first secondary winding, the second transformer may comprise a second secondary winding, the third transformer may comprise a third secondary winding, and the fourth transformer may comprise a fourth secondary winding. Each of these secondary winding may be wound around the core of a single transformer. In some embodiments, the first secondary winding, the second secondary winding, the third secondary winding, the fourth secondary winding, or the primary winding may comprise a single winding or a plurality of windings wound around the transformer core.

In some embodiments, the power supply 1540A, the power supply 1540B, the power supply 1540C, and/or the power supply 1540D may not share a return reference ground or a local ground.

The isolated fiber trigger 1545, for example, may also be isolated from other components of the high voltage switch 1500. The isolated fiber trigger 1545 may include a fiber optic receiver that allows each switch module 1505 to float relative to other switch modules 1505 and/or the other components of the high voltage switch 1500, and/or, for example, while allowing for active control of the gates of each switch module 1505.

In some embodiments, return reference grounds or local grounds or common grounds for each switch module 1505, for example, may be isolated from one another, for example, using an isolation transformer.

Electrical isolation of each switch module 1505 from common ground, for example, can allow multiple switches to be arranged in a series configuration for cumulative high voltage switching. In some embodiments, some lag in switch module timing may be allowed or designed. For example, each switch module 1505 may be configured or rated to switch 1 kV, each switch module may be electrically isolated from each other, and/or the timing of closing each switch module 1505 may not need to be perfectly aligned for a period of time defined by the capacitance of the snubber capacitor and/or the voltage rating of the switch.

In some embodiments, electrical isolation may provide many advantages. One possible advantage, for example, may include minimizing switch to switch jitter and/or allowing for arbitrary switch timing. For example, each switch 1510 may have switch transition jitters less than about 500 ns, 50 ns, 20 ns, 5 ns, etc.

In some embodiments, electrical isolation between two components (or circuits) may imply extremely high resistance between two components and/or may imply a small capacitance between the two components.

Each switch 1510 may include any type of solid state switching device such as, for example, an IGBT, a MOSFET, a SiC MOSFET, SiC junction transistor, FETs, SiC switches, GaN switches, photoconductive switch, etc. The switch 1510, for example, may be able to switch high voltages (e.g., voltages greater than about 1 kV), with high frequency (e.g., greater than 1 kHz), at high speeds (e.g., a repetition rate greater than about 500 kHz) and/or with fast rise times (e.g., a rise time less than about 25 ns) and/or with long pulse lengths (e.g., greater than about 10 ms). In some embodiments, each switch may be individually rated for switching 1,200 V-1,700 V, yet in combination can switch greater than 4,800 V-6,800 V (for four switches). Switches with various other voltage ratings may be used.

There may be some advantages to using a large number of lower voltage switches rather than a few higher voltage switches. For example, lower voltage switches typically have better performance: lower voltage switches may switch faster, may have faster transition times, and/or may switch more efficiently than high voltage switches. However, the greater the number of switches the greater the timing issues that may be required.

The high voltage switch 1500 shown in FIG. 15 includes four switch modules 1505. While four are shown in this figure, any number of switch modules 1505 may be used such as, for example, two, eight, twelve, sixteen, twenty, twenty-four, etc. For example, if each switch in each switch module 1505 is rated at 1200 V, and sixteen switches are used, then the high voltage switch can switch up to 19.2 kV. As another example, if each switch in each switch module 1505 is rated at 1700 V, and sixteen switches are used, then the high voltage switch can switch up to 27.2 kV.

In some embodiments, the high voltage switch 1500 may include a fast capacitor 1555. The fast capacitor 1555, for example, may include one or more capacitors arranged in series and/or in parallel. These capacitors may, for example, include one or more polypropylene capacitors. The fast capacitor 1555 may store energy from the high voltage source 1560.

In some embodiments, the fast capacitor 1555 may have low capacitance. In some embodiments, the fast capacitor 1555 may have a capacitance value of about 1 µF, about 5 µF, between about 1 µF and about 5 µF, between about 100 nF and about 1,000 nF etc.

In some embodiments, the high voltage switch 1500 may or may not include a crowbar diode 1550. The crowbar diode 1550 may include a plurality of diodes arranged in series or in parallel that may, for example, be beneficial for driving inductive loads. In some embodiments, the crowbar diode 1550 may include one or more Schottky diodes such as, for example, a silicon carbide Schottky diode. The crowbar diode 1550 may, for example, sense whether the voltage from the switches of the high voltage switch is above a certain threshold. If it is, then the crowbar diode 1550 may short the power from switch modules to ground. The crowbar diode, for example, may allow an alternating current path to dissipate energy stored in the inductive load after switching. This may, for example, prevent large inductive voltage spikes. In some embodiments, the crowbar diode 1550 may have low inductance such as, for example, 1 nH, 10 nH, 100 nH, etc. In some embodiments, the crowbar diode 1550 may have low capacitance such as, for example, 100 pF, 1 nF, 10 nF, 100 nF, etc.

In some embodiments, the crowbar diode 1550 may not be used such as, for example, when the load 1565 is primarily resistive.

In some embodiments, each gate driver circuit 1530 may produce less than about 1000 ns, 100 ns, 10.0 ns, 5.0 ns, 3.0 ns, 1.0 ns, etc. of jitter. In some embodiments, each switch 1510 may have a minimum switch on time (e.g., less than about 10 μs, 1 μs, 500 ns, 100 ns, 50 ns, 10, 5 ns, etc.) and a maximum switch on time (e.g., greater than 25 s, 10 s, 5 s, 1 s, 500 ms, etc.).

In some embodiments, during operation each of the high voltage switches may be switched on and/or off within 1 ns of each other.

In some embodiments, each switch module 1505 may have the same or substantially the same (±5%) stray inductance. Stray inductance may include any inductance within the switch module 1505 that is not associated with an inductor such as, for example, inductance in leads, diodes, resistors, switch 1510, and/or circuit board traces, etc. The stray inductance within each switch module 1505 may include low inductance such as, for example, an inductance less than about 300 nH, 100 nH, 10 nH, 1 nH, etc. The stray inductance between each switch module 1505 may include low inductance such as, for example, an inductance less than about 300 nH, 100 nH, 10 nH, 1 nH, etc.

In some embodiments, each switch module 1505 may have the same or substantially the same (±5%) stray capacitance. Stray capacitance may include any capacitance within the switch module 1505 that is not associated with a capacitor such as, for example, capacitance in leads, diodes, resistors, switch 1510 and/or circuit board traces, etc. The stray capacitance within each switch module 1505 may include low capacitance such as, for example, less than about 1,000 pF, 100 pF, 10 pF, etc. The stray capacitance between each switch module 1505 may include low capacitance such as, for example, less than about 1,000 pF, 100 pF, 10 pF, etc.

Imperfections in voltage sharing can be addressed, for example, with a passive snubber circuit (e.g., the snubber diode 1515, the snubber capacitor 1520, and/or the freewheeling diode 1525). For example, small differences in the timing between when each of the switches 1510 turn on or turn off or differences in the inductance or capacitances may lead to voltage spikes. These spikes can be mitigated by the various snubber circuits (e.g., the snubber diode 1515, the snubber capacitor 1520, and/or the freewheeling diode 1525).

A snubber circuit, for example, may include a snubber diode 1515, a snubber capacitor 1520, a snubber resistor 116, and/or a freewheeling diode 1525. In some embodiments, the snubber circuit may be arranged together in parallel with the switch 1510. In some embodiments, the snubber capacitor 1520 may have low capacitance such as, for example, a capacitance less than about 100 pF.

In some embodiments, the high voltage switch 1500 may be electrically coupled with or include a load 1565 (e.g., a resistive or capacitive or inductive load). The load 1565, for example, may have a resistance from 50 ohms to 500 ohms. Alternatively or additionally, the load 1565 may be an inductive load or a capacitive load.

Figure 16:
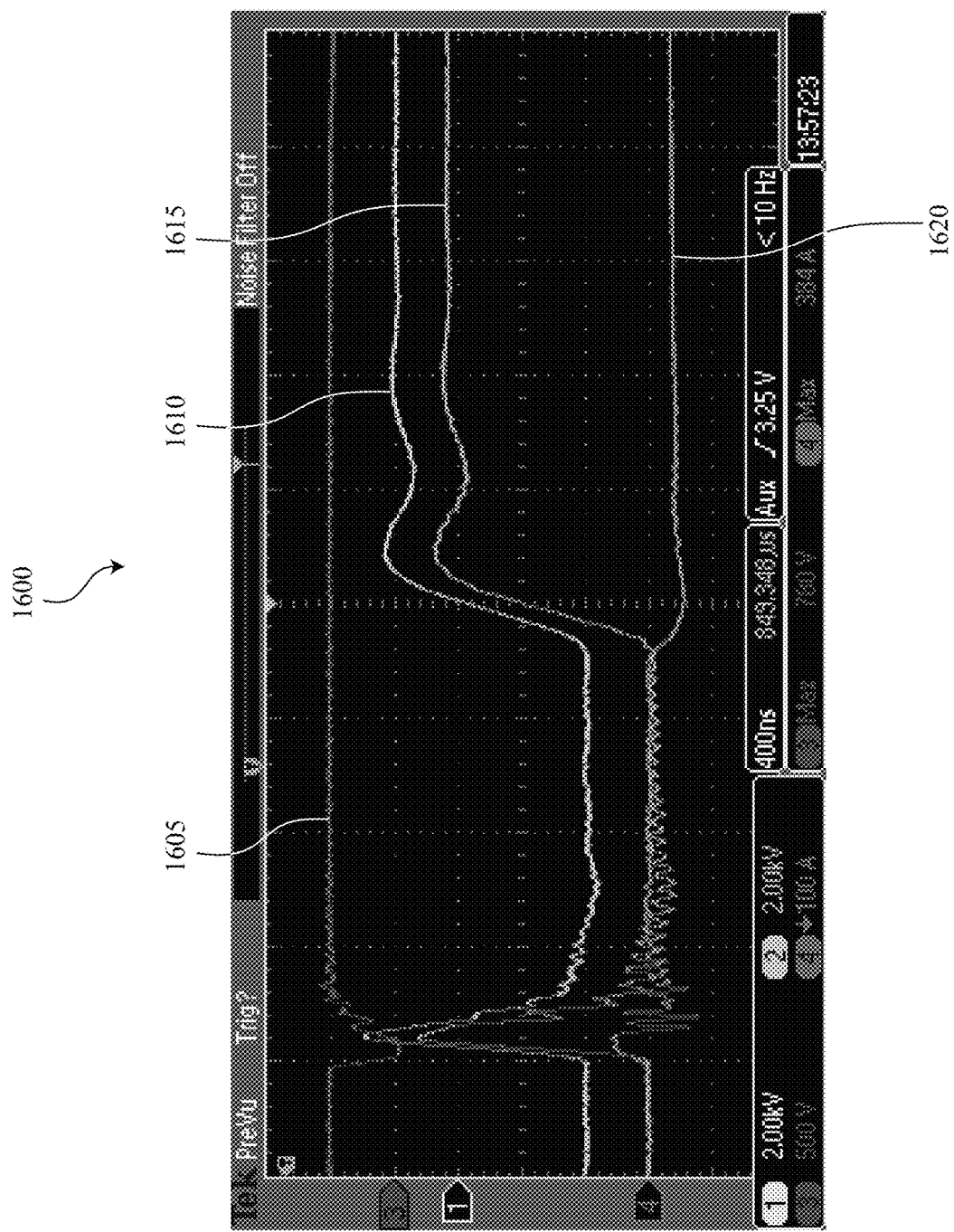
FIG. 16 shows an example waveform from a high voltage power system according to some embodiments.

FIG. 16 shows example waveforms 1600 from a high voltage power system according to some embodiments. The waveforms 1600 were produced from a high voltage power system producing a positive 2 kV bias (e.g., offset supply voltage V1 produces 2 kV) and outputs a signal with a peak voltage of 7 kV. In this example, a high voltage switch (e.g., high voltage switch 905) is included with the high voltage power system and is closed while the pulser stage is pulsing and open while the pulser stage is not pulsing.

The waveform 1605 represents the voltage from the pulser stage 101. The waveform 1610 represents the electrode voltage measured from ground to circuit point 124. The waveform 1615 represents the wafer voltage measured from ground to circuit point 122. The waveform 1620 represents the current through the bias compensation circuit 114.

The waveforms 1600 show the last pulse of a burst and the circuit returning to steady state after the burst. The waveform 1600 shows a continuous 2 kV offset between the electrode voltage and the wafer voltage. This offset voltage is the chucking voltage, and maintaining a continuous 2 kV chucking voltage as shown may be within the threshold required to avoid damage to the wafer.

Figure 17:
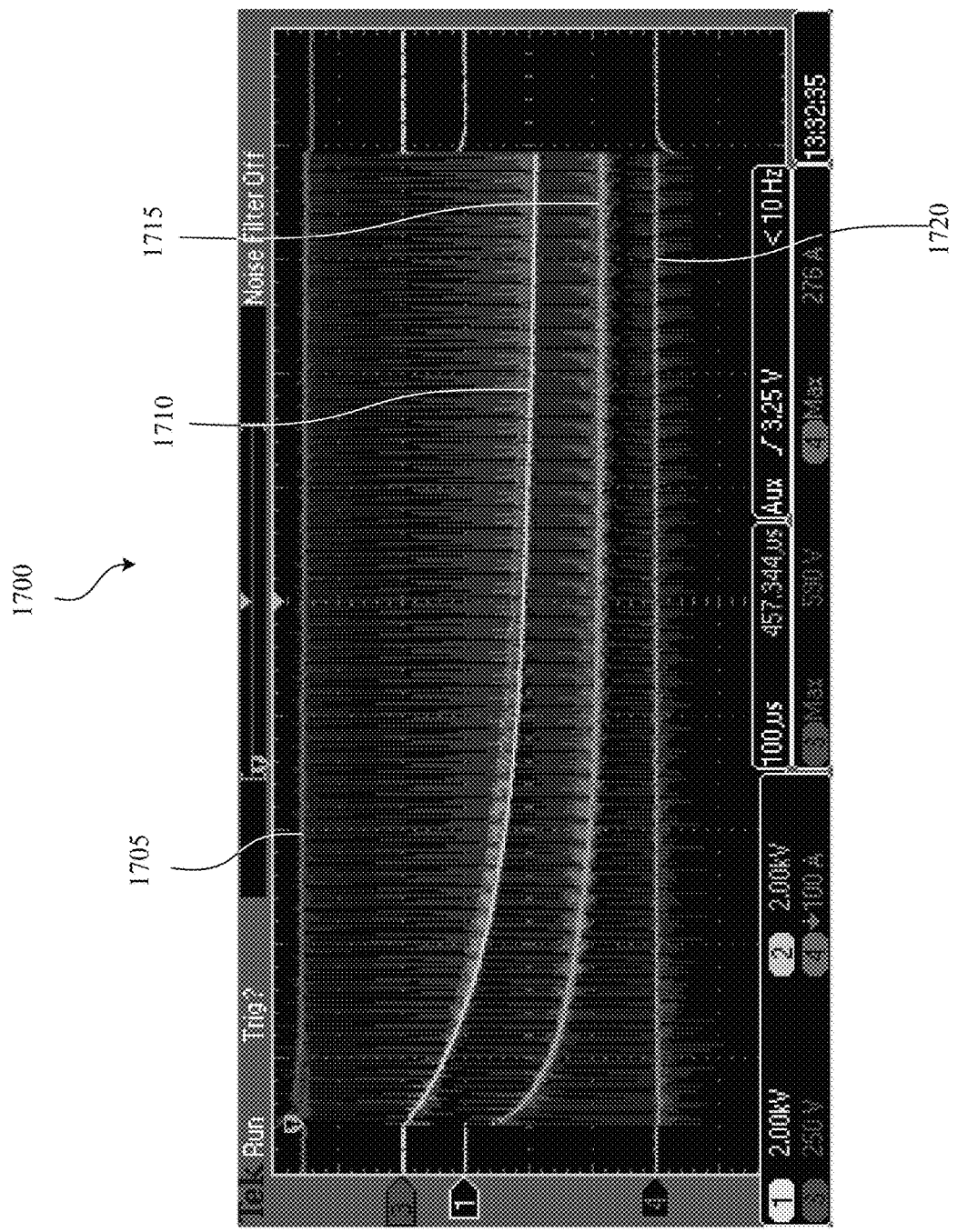
FIG. 17 shows an example waveform from a high voltage power system according to some embodiments.

FIG. 17 shows example waveforms 1700 from a high voltage power system according to some embodiments. The waveforms 1700 were produced from a high voltage power system producing a positive 2 kV bias (e.g., offset supply voltage V1 produces 2 kV) and outputs a signal with a peak voltage of 6 kV. In this example, a high voltage switch (e.g., high voltage switch 905) is included with the high voltage power system and is closed while the pulser stage is pulsing and open while the pulser stage is not pulsing.

The waveform 1705 represents the voltage from the pulser stage 101. The waveform 1710 represents the electrode voltage measured from ground to circuit point 124. The waveform 1715 represents the wafer voltage measured from ground to circuit point 122. The waveform 1720 represents the current through the bias compensation circuit 114.

The waveforms 1700 show all the pulses within a burst.

Figure 18:
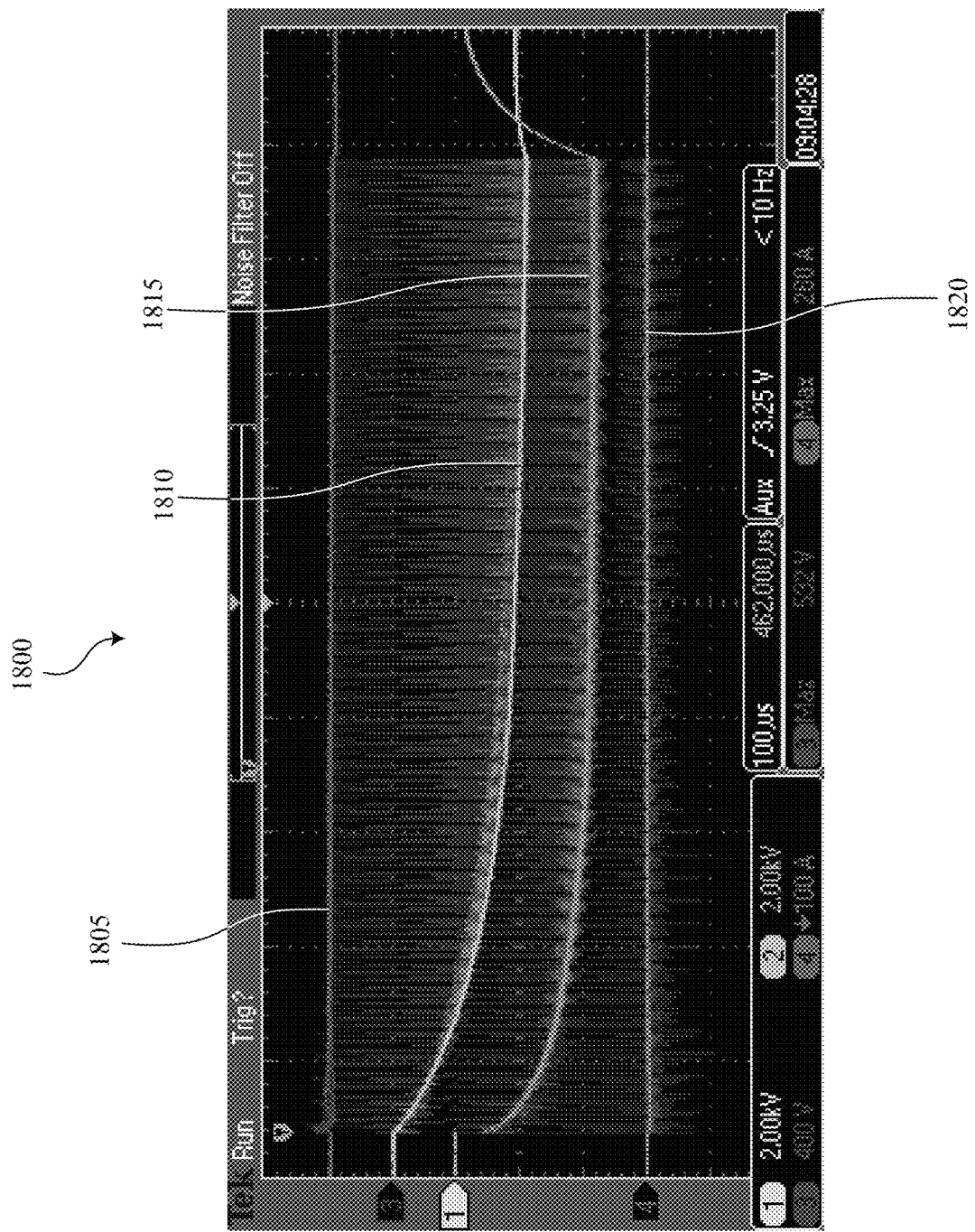
FIG. 18 shows an example waveform from a high voltage power system according to some embodiments.

FIG. 18 shows example waveforms 1800 from a high voltage power system according to some embodiments. The waveforms 1700 were produced from a high voltage power system producing a positive 2 kV bias (e.g., offset supply voltage V1 produces 2 kV) and outputs a signal with a peak voltage of 6 kV. In this example, a high voltage switch (e.g., high voltage switch 905) is not used. Without the high voltage switch enabling bias compensation, the waveforms 1800 shows that a constant 2 kV chucking voltage is not maintained at the end of the burst.

The waveform 1805 represents the voltage from the pulser stage 101. The waveform 1810 represents the electrode voltage measured from ground to circuit point 124. The waveform 1815 represents the wafer voltage measured from ground to circuit point 122. The waveform 1820 represents the current through the bias compensation circuit 114.

The waveforms 1800 show all the pulses within a burst.

Figure 19:
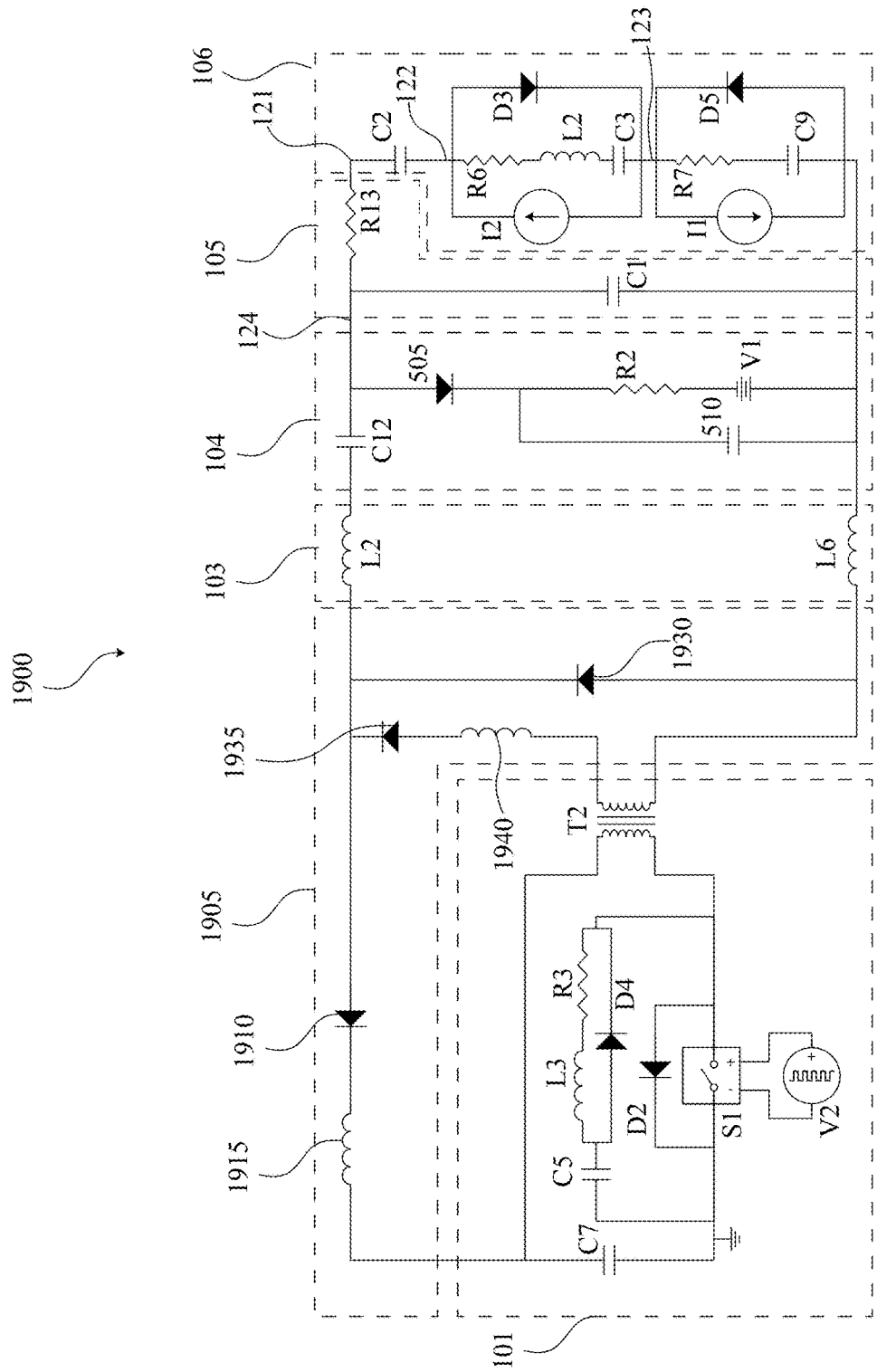
FIG. 19 is a circuit diagram of a high voltage power system with a plasma load according to some embodiments.

FIG. 19 is a circuit diagram of a high voltage power system with a plasma load 1900 according to some embodiments. The high voltage power system with the plasma load 1900 is similar to the high voltage power system with a plasma load 500 shown in FIG. 5. In this example, the resistive output stage 102 is removed and an energy recovery circuit 1905 has been added.

In this example, the energy recovery circuit 1905 may be positioned on or electrically coupled with the secondary side of the transformer T1. The energy recovery circuit 1905, for example, may include a diode 1930 (e.g., a crowbar diode) across the secondary side of the transformer T1. The energy recovery circuit 1905, for example, may include diode 1910 and inductor 1915 (arranged in series), which can allow current to flow from the secondary side of the transformer T1 to charge the power supply C7. The diode 1910 and the inductor 1915 may be electrically connected with the secondary side of the transformer T1 and the power supply C7. In some embodiments, the energy recovery circuit 1905 may include diode 1935 and/or inductor 1940 electrically coupled with the secondary of the transformer T1. The inductor 1940 may represent the stray inductance and/or may include the stray inductance of the transformer T1.

When the nanosecond pulser is turned on, current may charge the load stage 106 (e.g., charge the capacitor C3, capacitor C2, or capacitor C9). Some current, for example, may flow through inductor 1915 when the voltage on the secondary side of the transformer T1 rises above the charge voltage on the power supply C7. When the nanosecond pulser is turned off, current may flow from the capacitors within the load stage 106 through the inductor 1915 to charge the power supply C7 until the voltage across the inductor 1915 is zero. The diode 1930 may prevent the capacitors within the load stage 106 from ringing with the inductance in the load stage 106 or the bias compensation circuit 104.

The diode 1910 may, for example, prevent charge from flowing from the power supply C7 to the capacitors within the load stage 106.

The value of inductor 1915 can be selected to control the current fall time. In some embodiments, the inductor 1915 can have an inductance value between 1 µH-500 µH.

In some embodiments, the energy recovery circuit 1905 may include a switch that can be used to control the flow of current through the inductor 1915. The switch, for example, may be placed in series with the inductor 1915. In some embodiments, the switch may be closed when the switch S1 is open and/or no longer pulsing to allow current to flow from the load stage 106 back to the high voltage load C7. The switch, for example, may include a high voltage switch such as, for example, the high voltage switch 1500.

The energy recovery circuit 1905 may be added to the high voltage power system with a plasma load 700, the high voltage power system with a plasma load 900, the high voltage power system with a plasma load 1200, the high voltage power system with a plasma load 1300, or the high voltage power system with a plasma load 1400; and/or the resistive output stage 102 may be removed from any of these circuits.

In some embodiments, the pulser stage 101 may include the high voltage switch 1500 in place of or in addition to the various components shown in pulser stage 101. In some embodiments, using a high voltage switch 1500 may allow for removal of at least the transformer T1 and the switch S1.

Figure 20:
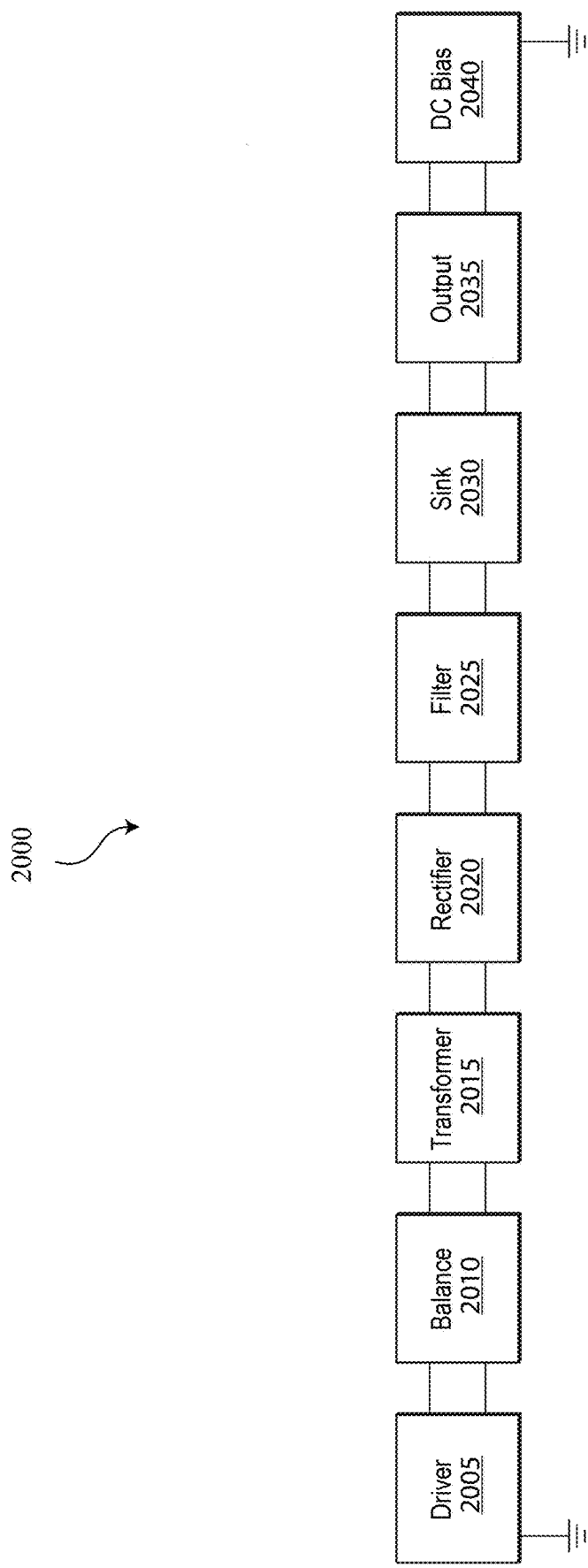
FIG. 20 is an example block diagram of a pulse generator according to some embodiments.

FIG. 20 is an example block diagram of a pulse generator 2000 according to some embodiments. The pulse generator 2000 may include one or more stages or blocks as shown in the figure. One or more of these stages may be removed, replaced with another stage, and/or combined with another stage. A driver stage 2005 that includes any components or devices that may push or pull current. The driver stage 2005 is coupled with a balance stage 2010. The balance stage 2010 can be used, for example, to keep a transformer stage 2015 from saturating due to imbalanced current. The driver stage may include one or more energy sources, switches, bridges, etc. The one or more switches may include, for example, one or more IGBTs, switches, solid state switches, MOSFET, may be used to switch the energy source. As another example, the driver stage may include a waveform generator that may be used to produce an input waveform. In some embodiments, a waveform that is to be amplified may be provided to the driver from an external source. In some embodiments, an IGBT circuit(s) may be used with the driver stage 2005 such as, for example, the IGBT circuit discussed in U.S. patent application Ser. No. 13/345,906, entitled Efficient IGBT Switching the entirety of which is incorporated by reference in its entirety.

In some embodiments, the driver stage 2005 may include an H-bridge, a half bridge, or a full bridge. An example of a full bridge configuration is shown in FIG. 4. Any number of configurations of input sources may be used without limitation. Various other configurations or circuits may be included such as, for example, resonant topologies and push-pull topologies.

At fixed voltage, the time rate of change of current through a given circuit may be inversely proportional to the inductance of the circuit. Thus, in some embodiments, in order to produce fast rise times, the driver stage 2005, for example, may have a low total inductance. In some embodiments, the driver stage 2005 may have a total inductance below 1,000 nH. In some embodiments, the inductance of all components, circuits, elements, etc. prior to a transformer or transformers of a transformer stage may have a total inductance less than 1,000 nH. In some embodiments, the inductance of all components, circuits, elements, etc. including the primary winding of one of more transformers of the transformer stage 2015 may have an inductance less than 1,000 nH. In some embodiments, the inductance of all components, circuits, elements, etc. om the driver stage 2005 and the balance stage 2010 may have a total inductance less than 1,000 nH.

In some specific embodiments, the driver stage 2005 may have a total inductance below 1,000 nH. In some specific embodiments, the inductance of all components, circuits, elements, etc. prior to a transformer or transformers of a transformer stage may have a total inductance less than 1,000 nH. In some specific embodiments, the inductance of all components, circuits, elements, etc. including the primary winding of one of more transformers of the transformer stage 2015 may have an inductance less than 1,000 nH. In some specific embodiments, the inductance of all components, circuits, elements, etc. om the driver stage 2005 and the balance stage 2010 may have a total inductance less than 1,000 nH.

The balance stage 2010 may also be coupled with the transformer stage 2015 that may include one or more transformers each having any number of coils. The transformer stage 2015 may also increase the voltage from the driver stage 2005 and/or the balance stage 2010 depending on the number of winds on either side of the transformer stage 2015. The transformer stage 2015 may provide, for example, galvanic isolation between the driver stage 2005 and the output stage 2035. The transformer stage 2015 may also provide, for example, step up from the input voltage provided by the driver stage 2005 to an increased voltage output.

The transformer stage 2015 may be coupled with a rectifier stage 2020. The filter stage 2025 may be coupled with the rectifier stage 2020. The filter stage 2025 may include any number of components such as, for example, active components (e.g., switches, diodes, etc.) and/or passive components (e.g., inductors, capacitors, resistors, etc.)

The transformer stage may include a transformer that transforms an input signal into a high voltage output signal. The high voltage output signal may have a voltage of 500 volts, 1,000 volts, 2000 volts, 10,000 volts and/or 100,000 volts, or higher.

The sink stage 2030 may be placed after the filter stage 2025 as shown in FIG. 20 or placed before the filter stage 2025. The sink stage 2030 may, for example, dump energy, sink current, and/or rapidly reverse current flow of any energy stored in the filter stage 2025 and/or the output stage 2035.

The output stage 2035 may be coupled with the sink stage 2030 as shown in FIG. 20 or may be coupled with the filter stage 2025 and/or the rectifier stage 2020. The output stage 2035 may include the load and/or the device to which the output signal is sent. The output stage 2035 may be galvanically isolated form a reference signal, from ground, and/or from the driver stage 2005. In some embodiments, the output stage can be floating or biased to any potential desired (e.g., with the DC bias stage 2040). In some embodiments, the output stage 2035 may output a signal with a rise time of less than 100 ns and/or a fall time of less than 100 ns.

The DC bias stage 2040 may be coupled with the output stage 2035 and may include any voltage source and/or power source. The DC bias stage 2040, for example, may be connected with a reference signal, ground, and/or the driver stage. In some embodiments, the DC bias stage 2040 may reference the potential of the output stage 2035 to the potential of the driver stage 2005 of the pulse generator 2000. The DC bias stage 2040, for example, may be coupled to the rectifier stage 2020, the filter stage 2025, the sink stage 2030, and/or the output stage 2035. The DC bias stage 2040, for example, may be of any polarity and/or may include any voltage. In some embodiments, the DC bias stage 2040 may provide a DC bias signal, for example, having a voltage greater than 0.01 kV, 0.1 kV, 1 kV, 3 kV, 10 kV, 30 kV, or 100 kV. In some specific embodiments, the DC bias voltage may be greater than 0.1 kV or 1 kV.

The driver stage 2005, for example, may include any device or components that may push or pull current in the pulse generator 2000. The driver stage 2005, for example, may include one or more high voltage power supplies or voltage sources that may provide an input voltage of 50 volts, 100 volts, 200 volts, 300 volts, 400 volts, 500 volts, 600 volts, 700 volts, 800 volts, 900 volts, etc. to over 4500 volts. The driver stage 2005, for example, may include one or more solid state switches such as, for example, one or more IGBTs and/or one or more MOSFETs that can be used to the switch the high voltage power supply. In some embodiments, the solid state switches may operate at voltages up to 2 kV or up to 4.5 kV.

In some embodiments, the driver stage 2005 may include one or more H-bridge circuits and/or half-bridge circuits operated in parallel. Each H-bridge circuit may include, for example, one or more solid state switches. Moreover, the driver stage 2005, for example, may or may not be coupled with a reference signal and/or with ground potential. The one or more solid state switches, for example, may switch at a frequency of 0.1 kHz, 1 kHz, 10 kHz, 100 kHz, 1,000 kHz, 10,000 kHz, etc.

In some embodiments, the stray inductance, L1 and L2, of the driver stage 2005 singularly or in combination may be less than 1 nH, 10 nH, 100 nH, 1,000 nH, 10,000 nH, etc. In some specific embodiments, the stray inductance L1 and/or L2 may be less than 100 nH or 1,000 nH. In some specific embodiments, the stray inductance, L1 and L2, may represent and/or include all inductance such as, for example, stray inductance in the circuit, inductors, inductance in components, etc.

In some embodiments, the driver stage 2005 may include one or more power sources that may provide voltage at 50 volts, 100 volts, 200 volts, 300 volts, 400 volts, 500 volts, 600 volts, 700 volts, 800 volts, 900 volts, etc. to over 4500 volts. In some specific embodiments, the voltage provided by the one or more power sources in the driver stage 2005 may be greater than 100 V or 500 V.

Figure 21:
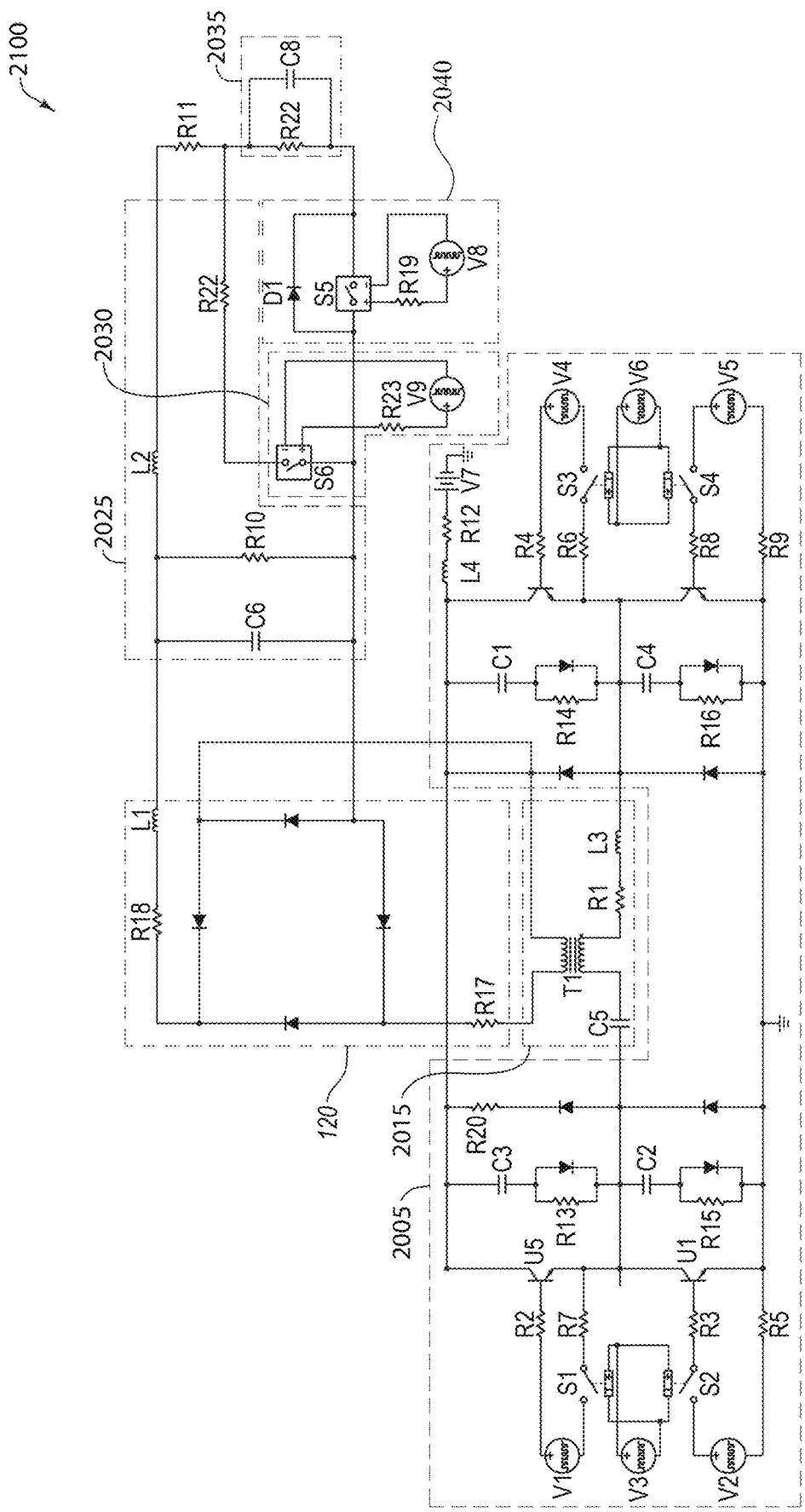
FIG. 21 is an example circuit diagram that may comprise all or part of a pulse generator according to some embodiments described in this document.

FIG. 21 is an example circuit diagram 2100 that may comprise all or part of a pulse generator according to some embodiments described in this document. The circuit diagram 2100 includes driver stage 2005, transformer stage 2015, rectifier stage 2020, filter stage 2025, sink stage 2030, and output stage 2035.

In some embodiments, the output stage 2035 can be galvanically isolated from ground, from the driver stage, and/or from any reference potential.

In this embodiment, the filter stage 2025 includes a switch S5. The output of the rectifier stage 2020 can then be directly switched by the switch S5. In some embodiments, the filter stage 2025 and/or the switch S5 may be coupled with or be part of the DC bias stage 2040.

The sink stage 2030 may include switch S6. In some embodiments, switch S5 and switch S6 may be fast switches that open and close within 1 μs or faster. In some embodiments, the switch S5 and/or the switch S6 are switches that may operate at high frequencies. The sink stage 2030 may include any or all the components or features of the resistive output stage 102 described above.

Figure 22A:
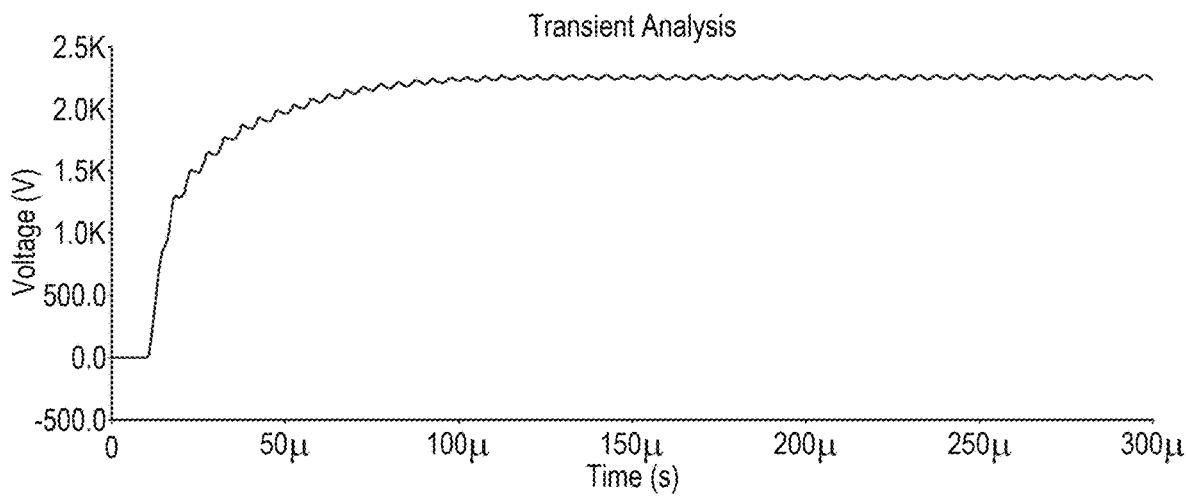
FIGS. 22A, 22B and 22C are example graphs of an output pulse according to some embodiments described in this document.
Figure 22B:
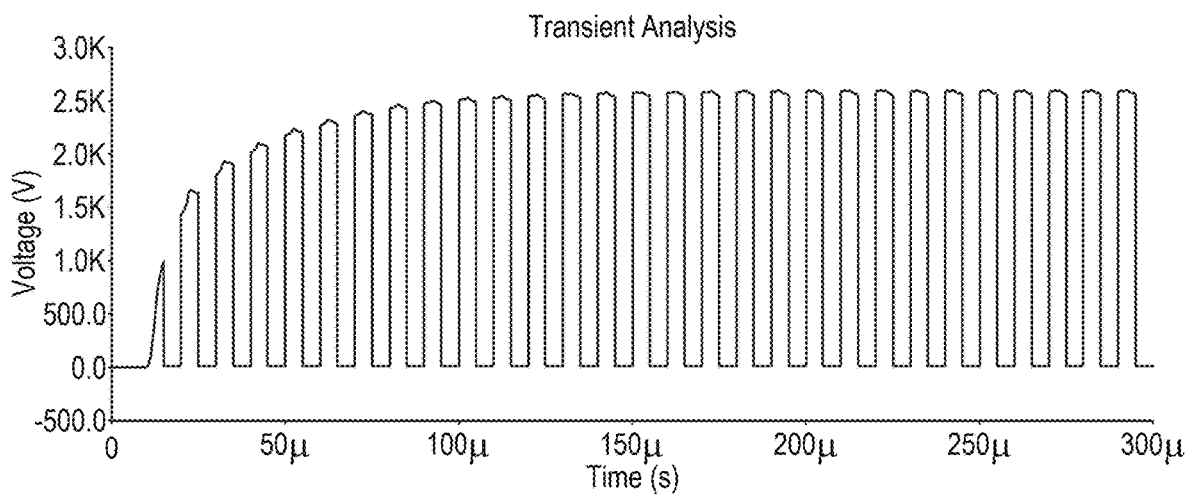
Figure 22C:
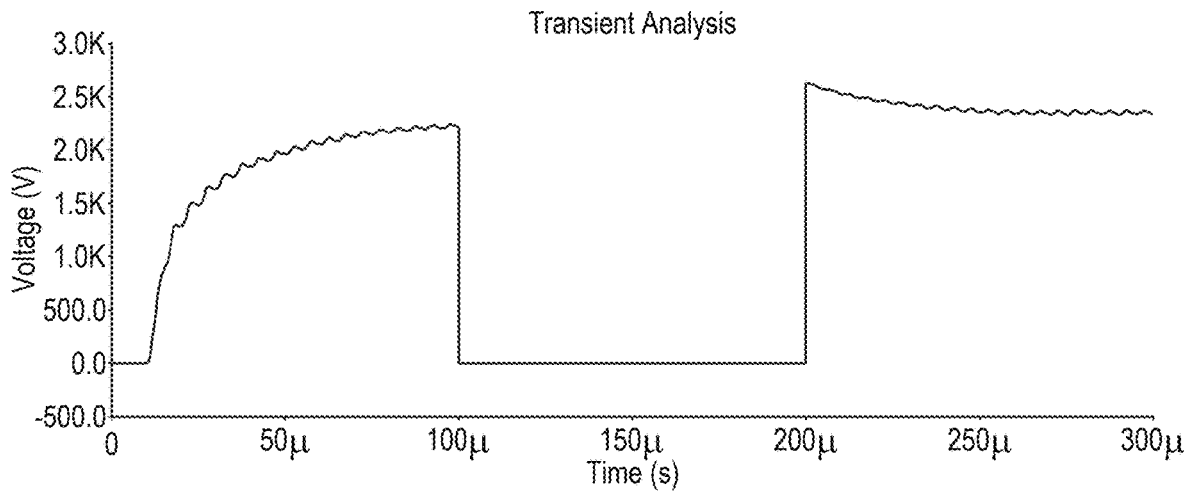

When the switch S5 is closed DC power can be sourced to the output stage 2035 (or the load R22 and/or R11). A graph of the voltage over time at the output stage 2035 is shown in FIG. 22. If switch S5 is switched on and off, then a pulsed waveform can be sourced to the output stage 2035. Switch S6 can be opened when switch S5 closes and closed when switch S5 opens. When switch S6 is closed, capacitance can be drained from the load capacitance represented as C8. The switches used by switch S5 and/or switch S6 may operate at high power, high frequency, with variable duty cycle, at variable pulse widths, etc.

Switch S5 and/or switch S6 may include one or more solid state switches such as, for example, one or more MOSFETs and/or one or more IGBTs. Moreover, in some embodiments, switch S5 and/or switch S6 may also include one or more switches stacked, arranged in parallel, and/or arranged in series.

In some embodiments, a controller may be included that controls the operation and/or timing of switch S5 and/or switch S6 as the duty cycle, pulse width, and/or frequency are changed and to ensure that switch S5 is closed when switch S6 is open and vice-versa. These switches may include solid state switches and/or IGBT circuits discussed in U.S. patent application Ser. No. 13/345,906, entitled Efficient IGBT Switching the entirety of which is incorporated into this document by reference in its entirety.

In some embodiments, the emitter of switch S5 and/or switch S6 may not be referenced back to ground. That is, the emitter of switch S5 and/or switch S6 may be galvanically isolated from all or part of the circuit. Moreover, the gate of switch S5 and/or switch S6 may be isolated using a fiber optic receiver and/or a fiber optic device.

In some embodiments, the size, shape, frequency, and/or duty cycle of pulses produced by the pulse generator may be controllable (or varied by user input). For example, the pulses can vary from a DC output to a 10 MHz output with duty cycles from 0% to 100%. In some embodiments, the galvanic isolation allows the output waveform potential to be set to arbitrary potential levels with respect to other system potentials. In some embodiments galvanic isolation may be 500 V, 1 kV, 2 kV, 3 kV, 5 kV, 10 kV, 20 kV, 100 kV, etc. with respect to other potentials. Some embodiments include a combination of two or more output stages to both provide and to sink high power and/or currents to and from the load. The combination of output stages may allow for precise control of arbitrary pulses to be delivered to both resistive and capacitive loads.

In some embodiments, the pulse generator may smooth a high frequency input signal to generate a high voltage output signal that has a voltage higher than the input signal. In order to accomplish such smoothing, a pulse generator may require that the input signal include at least one of a high frequency, fast rise times, and fast fall times. In some embodiments, the high frequency of the input signal may be five to ten times greater than the output signal. Moreover, the higher the input frequency of the input signal, the smoother the output signal.

In some embodiments, a pulse generator may generate high voltage pulses with fast rise times of various types such as, for example, square waves, sinusoidal waves, triangular waves, arbitrary waves, long single pulses, multiple pulses, etc.

In some embodiments, a pulse generator may generate high voltage pulses having an arbitrary waveform that has a fast rise time (e.g., less than 1 μs). In some embodiments, a pulse generator may generate a high voltage pulses that have a variable duty cycle or user controlled duty cycle.

In some embodiments, a pulse generator can output high voltage greater than 0.5 kV, 1.0 kV, 2.0 kV, 5.0 kV, 10 kV, 15 kV, 20 kV, 25 kV, 50 kV, 100 kV, or 1,000 kV.

In some embodiments, the input signal may be greater than about 50 kHz or 100 kHz.

Unless otherwise specified, the term "substantially" means within 5% or 10% of the value referred to or within manufacturing tolerances. Unless otherwise specified, the term "about" means within 5% or 10% of the value referred to or within manufacturing tolerances.

The term "or" is inclusive.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations, or additions to the present subject matter as would be readily apparent to one of ordinary skill in the art.

That which is claimed:

1. A high voltage power system comprising:
   a power supply;
   a plurality of switches electrically coupled with the power supply;
   a transformer comprising:
      a transformer core;
      a primary winding wound around the transformer core, the primary winding electrically coupled with the plurality of switches; and
      a secondary winding wound around the transformer core; and
   an output electrically coupled with the secondary winding of the transformer, wherein opening and closing the plurality of switches produces an output of a plurality of high voltage pulses with a pulse width less than 500 ns, an amplitude greater than 1 kV, and a pulse repetition frequency greater than 1 kHz;
   wherein the transformer provides galvanic isolation between the output and ground;
   wherein the plurality of switches are disposed between the power supply and the transformer.

2. The high voltage power system according to claim 1, wherein the plurality of switches and the primary winding have an inductance less than 1,000 nH.

3. The high voltage power system according to claim 1, further comprising a bias compensation circuit arranged across the output, the bias compensation circuit comprising:
   a bias compensation diode; and
   a DC power supply arranged in series with the bias compensation diode.

4. The high voltage power system according to claim 1, wherein the primary winding comprises a single turn primary winding wound once or less than once around the transformer core.

5. The high voltage power system according to claim 1, wherein the primary winding comprises a plurality of single windings that are each wound once or less than once around the transformer core.

6. The high voltage power system according to claim 1, wherein the primary winding comprises one or more wires wound one or fewer times around the transformer core.

7. The high voltage power system according to claim 1, wherein the primary winding comprises a conductive sheet.

8. The high voltage power system according to claim 1, wherein the plurality of switches are arranged in series.

9. The high voltage power system according to claim 1, further comprising an energy recovery circuit coupled with the output and the power supply.

10. The high voltage power system according to claim 1, wherein the plurality of switches are arranged in parallel.

11. A high voltage power system comprising:
a power supply;
a plurality of switches electrically coupled with the power supply;
a transformer comprising:
   a transformer core;
   a primary winding wound around the transformer core, the primary winding electrically coupled with the plurality of switches; and
   a secondary winding wound around the transformer core; and
an output electrically coupled with the secondary winding of the transformer, wherein opening and closing the plurality of switches produces an output of a plurality of high voltage pulses with an amplitude greater than 1 kV, a pulse width less than 500 ns, and a pulse repetition frequency greater than 1 kHz;
wherein the transformer provides galvanic isolation between the output and the plurality of switches;
wherein the plurality of switches are disposed between the power supply and the transformer.

12. The high voltage power system according to claim 1, further comprising a bias compensation circuit arranged across the output, the bias compensation circuit comprising:
   a bias compensation diode; and
   a DC power supply arranged in series with the bias compensation diode.

13. The high voltage power system according to claim 12, wherein the primary winding comprises a single turn primary winding wound once or less than once around the transformer core.

14. The high voltage power system according to claim 12, wherein the primary winding comprises a plurality of single windings that are each wound once or less than once around the transformer core.

15. The high voltage power system according to claim 12, wherein the primary winding comprises one or more wires wound one or fewer times around the transformer core.

16. The high voltage power system according to claim 12, wherein the primary winding comprises a conductive sheet.

17. The high voltage power system according to claim 12, wherein the plurality of switches are arranged in series.

18. The high voltage power system according to claim 12, further comprising an energy recovery circuit coupled with the output and the power supply.

19. The high voltage power system according to claim 12, wherein the plurality of switches are arranged in parallel.

20. The high voltage power system according to claim 12, wherein the plurality of switches and the primary winding have an inductance less than 1,000 nH.

21. A high voltage power system comprising:
a power supply;
a plurality of switches electrically coupled with the power supply;
a transformer comprising:
   a transformer core;
   a primary winding wound around the transformer core, the primary winding electrically coupled with the plurality of switches; and
   a secondary winding wound around the transformer core;
an output electrically coupled with the secondary winding of the transformer, wherein opening and closing the plurality of switches produces an output of a plurality of high voltage pulses with an amplitude greater than 1 kV, a pulse width less than 500 ns, and a pulse repetition frequency greater than 1 kHz; and
an energy recovery circuit coupled with the output and the power supply;
wherein the transformer provides galvanic isolation between the output and the plurality of switches and/or between the output and ground;
wherein the plurality of switches are disposed between the power supply and the transformer.

* * * * *